(12) United States Patent
Jeunink et al.

(10) Patent No.: US 11,664,264 B2
(45) Date of Patent: May 30, 2023

(54) LITHOGRAPHIC APPARATUS, METHOD FOR UNLOADING A SUBSTRATE AND METHOD FOR LOADING A SUBSTRATE

(71) Applicant: ASML NETHERLANDS B.V., Veldhoven (NL)

(72) Inventors: Andre Bernardus Jeunink, Bergeijk (NL); Robby Franciscus Josephus Martens, Eindhoven (NL); Youssef Karel Maria De Vos, Lille (BE); Ringo Petrus Cornelis Van Dorst, Eindhoven (NL); Gerhard Albert Ten Brinke, Eindhoven (NL); Dirk Jerome Andre Senden, Eindhoven (NL); Coen Hubertus Matheus Baltis, Eindhoven (NL); Justin Johannes Hermanus Gerritzen, Eindhoven (NL); Jelmer Mattheüs Kamminga, Tilburg (NL); Evelyn Wallis Pacitti, Eindhoven (NL); Thomas Poiesz, Veldhoven (NL); Arie Cornelis Scheiberlich, Veldhoven (NL); Bert Dirk Scholten, Best (NL); André Schreuder, Eindhoven (NL); Abraham Alexander Soethoudt, Eindhoven (NL); Siegfried Alexander Tromp, Wessel (NL); Yuri Johannes Gabriël Van De Vijver, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 179 days.

(21) Appl. No.: 16/075,754

(22) PCT Filed: Dec. 22, 2016

(86) PCT No.: PCT/EP2016/082484
§ 371 (c)(1),
(2) Date: Aug. 6, 2018

(87) PCT Pub. No.: WO2017/137129
PCT Pub. Date: Aug. 17, 2017

(65) Prior Publication Data
US 2019/0043749 A1  Feb. 7, 2019

(30) Foreign Application Priority Data

Feb. 8, 2016 (EP) .................................. 16154599
Jun. 2, 2016 (EP) .................................. 16172678

(51) Int. Cl.
*H01L 21/683* (2006.01)
*H01L 21/687* (2006.01)
(Continued)

(52) U.S. Cl.
CPC ........ *H01L 21/6838* (2013.01); *B25B 11/005* (2013.01); *G03F 7/707* (2013.01); *G03F 7/70733* (2013.01); *H01L 21/68742* (2013.01)

(58) Field of Classification Search
CPC .......... H01L 21/6838; H01L 21/68742; B25B 11/005; B25B 11/00; B25B 11/007;
(Continued)

(56) References Cited

U.S. PATENT DOCUMENTS

| 4,509,852 A | 4/1985 | Tabarelli et al. |
| 5,191,218 A * | 3/1993 | Mori ...................... G03F 7/707 |
| | | 250/453.11 |

(Continued)

FOREIGN PATENT DOCUMENTS

| CN | 101950130 A | 1/2011 |
| CN | 102117018 A | 7/2011 |

(Continued)

OTHER PUBLICATIONS

English Machine translation of JP002991l1B2. (Year: 1999).*
(Continued)

*Primary Examiner* — Lee D Wilson
*Assistant Examiner* — Alberto Saenz
(74) *Attorney, Agent, or Firm* — Pillsbury Winthrop Shaw Pittman, LLP

(57) ABSTRACT

A method for unloading a substrate from a support table configured to support the substrate, the method including: supplying gas to a gap between a base surface of the support table and the substrate via a plurality of gas flow openings
(Continued)

in the support table, wherein during an initial phase of unloading the gas is supplied through at least one gas flow opening in an outer region of the support table and not through any gas flow opening in a central region of the support table radially inward of the outer region, and during a subsequent phase of unloading the gas is supplied through at least one gas flow opening in the outer region and at least one gas flow opening in the central region.

24 Claims, 10 Drawing Sheets

(51) Int. Cl.
    *G03F 7/20*         (2006.01)
    *B25B 11/00*      (2006.01)

(58) Field of Classification Search
    CPC ....... G03F 7/707; G03F 7/70733; B23Q 3/08; B23Q 3/088
    USPC ........................ 269/21, 20; 29/559
    See application file for complete search history.

(56) References Cited

U.S. PATENT DOCUMENTS

| | | | |
|---|---|---|---|
| 5,374,829 | A | 12/1994 | Sakamoto et al. |
| 6,257,564 | B1 | 7/2001 | Avneri et al. |
| 7,214,548 | B2 | 5/2007 | Fayaz et al. |
| 7,834,974 | B2 | 11/2010 | Kemper et al. |
| 8,638,421 | B2 | 1/2014 | Kadijk et al. |
| 9,099,501 | B2 | 8/2015 | Kemper et al. |
| 9,448,494 | B2 | 9/2016 | Kemper et al. |
| 9,766,556 | B2 | 9/2017 | Kemper et al. |
| 9,798,253 | B2 | 10/2017 | Van Sommeren et al. |
| 2002/0008864 | A1 | 1/2002 | Kondo |
| 2003/0168174 | A1 | 9/2003 | Foree |
| 2004/0036850 | A1 | 2/2004 | Tsukamoto et al. |
| 2004/0179183 | A1 | 9/2004 | Van Ballegoij et al. |
| 2004/0207824 | A1 | 10/2004 | Lof et al. |
| 2006/0055073 | A1* | 3/2006 | Fayaz ................. H01L 21/6838 264/101 |
| 2007/0030464 | A1 | 2/2007 | Kemper et al. |
| 2008/0165330 | A1 | 7/2008 | Mizutani |
| 2008/0171131 | A1* | 7/2008 | Moro ................. H01L 21/6875 427/8 |
| 2008/0239275 | A1 | 10/2008 | Mizutani et al. |
| 2009/0091716 | A1 | 4/2009 | Kadijk et al. |
| 2010/0045949 | A1 | 2/2010 | Nakano et al. |
| 2013/0038854 | A1 | 2/2013 | Kunnen et al. |
| 2015/0200144 | A1 | 7/2015 | Jang et al. |
| 2017/0045828 | A1 | 2/2017 | Van Sommeren et al. |

FOREIGN PATENT DOCUMENTS

| | | |
|---|---|---|
| CN | 103367217 A | 10/2013 |
| CN | 103904013 A | 7/2014 |
| EP | 0 803 904 | 10/1997 |
| EP | 1420298 A2 | 5/2004 |
| EP | 01431825 | 6/2004 |
| EP | 1962329 A1 | 8/2008 |
| GB | 2 149 697 | 10/1984 |
| JP | 56-80141 A | 7/1981 |
| JP | 9-295236 A | 11/1997 |
| JP | 2991110 B2 | 10/1999 |
| JP | 2991110 B2 * | 12/1999 |
| JP | 3102850 B2 | 8/2000 |
| JP | 2005-012009 A | 1/2005 |
| JP | 2007-273693 A | 10/2007 |
| JP | 2008-177303 A | 7/2008 |
| JP | 2009-117567 A | 5/2009 |
| JP | 2010-039227 A | 2/2010 |
| JP | 2010-128079 A | 6/2010 |
| JP | 2013-038420 A | 2/2013 |
| JP | 2014-116433 A | 6/2014 |
| JP | 2015-018927 A | 1/2015 |
| JP | 2017-130560 A | 7/2017 |
| KR | 2003-0028985 A | 4/2003 |
| WO | 99/49504 A1 | 9/1999 |
| WO | 2005/059977 A1 | 6/2005 |
| WO | 2006/077859 A1 | 7/2008 |
| WO | 2008/156366 A1 | 12/2008 |
| WO | 2015/043638 A1 | 4/2015 |
| WO | 2015/165653 A1 | 11/2015 |
| WO | 2015/169616 A1 | 11/2015 |

OTHER PUBLICATIONS

Office Action dated Feb. 3, 2020 issued in corresponding Japanese Patent Application No. 2018-536098 with English translation.
International Search Report dated Mar. 7, 2018 issued in corresponding International Application No. PCT/EP2016/082484.
Office Action dated Nov. 30, 2017 issued in corresponding Taiwanese Patent Application No. 106100929.
Notice of Reasons for Rejection dated Oct. 13, 2021, issued in corresponding Japanese Patent Application No. 2020-182045 with English translation (12 pgs.).

* cited by examiner

LITHOGRAPHIC APPARATUS, METHOD FOR UNLOADING A SUBSTRATE AND METHOD FOR LOADING A SUBSTRATE

CROSS-REFERENCE TO RELATED APPLICATIONS

This application is the U.S. national phase entry of PCT patent application no. PCT/EP2016/082484, which was filed on Dec. 22, 2016, which claims the benefit of priority of European patent application no. 16154599.1, and European patent application no. 16172678.1, which were filed on Feb. 8, 2016 and Jun. 2, 2016, respectively, and each of which is incorporated herein in its entirety by reference.

FIELD

The present invention relates to a lithographic apparatus, a method for unloading a substrate and a method for loading a substrate, particularly onto a support table for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is ultra-pure water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and support table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a bather to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In both an immersion apparatus or in a dry apparatus, a substrate is clamped to a support table during exposure processes. The clamping may be assisted by having the gap between the substrate and the support table at a lower pressure compared to ambient pressure. Ambient pressure is the pressure surrounding the substrate and the support table. The region enclosed by the support table and the substrate may be at near vacuum pressure such that the substrate is vacuum clamped to the support table.

The support table comprises one or more holes formed in it. The holes facilitate clamping of the substrate. Gas may be extracted through the holes from the gap enclosed by the substrate and the support table, thereby reducing the pressure in this gap for clamping of the substrate.

The substrate is loaded onto the support table. During loading of the substrate, the substrate can deform due to gravity. The substrate can be clamped in its deformed state, which increases overlay.

During unloading, the near vacuum pressure may be applied for some areas of the substrate and not others. Where the near vacuum pressure is not applied (e.g. released), the substrate can come away from the support table. In other areas where the near vacuum pressure is still applied the substrate can slip. This can cause wearing of the support table where the substrate slips. The periphery of the upper surface of the support table is particularly prone to wearing.

It is desirable, for example, to provide a lithographic apparatus, a method of unloading a substrate and a method of loading a substrate in which flatness of the clamped substrate is improved and/or wear of the support table is reduced.

According to an aspect of the invention, there is provided a method for unloading a substrate from a support table configured to support the substrate, the method comprising: supplying gas to a gap between a base surface of the support table and the substrate via a plurality of gas flow openings in the support table, wherein during an initial phase of unloading the gas is supplied through at least one gas flow opening in an outer region of the support table and not through any gas flow opening in a central region of the support table radially inward of the outer region, and during a subsequent phase of unloading the gas is supplied through at least one gas flow opening in the outer region and at least one gas flow opening in the central region.

According to an aspect of the invention, there is provided a method for loading a substrate onto a support table configured to support the substrate, the method comprising: extracting gas from a gap between a base surface of the support table and the substrate via a plurality of gas flow openings in the support table, wherein during a first phase of loading the gas is extracted through at least one gas flow opening in a central region of the support table and not through any gas flow opening in an intermediate region of the support table radially outward of the central region and any gas flow opening in an outer region of the support table radially outward of the intermediate region, during a second phase of loading the gas is extracted through at least one gas flow opening in the central region and at least one gas flow opening in the intermediate region and not through any gas flow opening in the outer region, and during a third phase of loading the gas is extracted through at least one gas flow opening in the central region, at least one gas flow opening in the intermediate region and at least one gas flow opening in the outer region.

According to an aspect of the invention, there is provided a method for loading a substrate onto a support table configured to support the substrate, the method comprising: lowering the substrate towards the support table; when the substrate is being lowered towards the support table, controlling an underpressure source to apply an underpressure so as to extract gas from a gap between a base surface of the support table and the substrate via a plurality of gas flow openings in the support table, when the substrate reaches a predetermined distance above the support table, controlling the underpressure source to stop applying an underpressure in fluid communication with any of the gas flow openings in the support table; and when the substrate has touched down onto the support table, controlling the underpressure source to restart applying an underpressure so as to extract the gas via the plurality of gas flow openings in the support table.

According to an aspect of the invention, there is provided a method for loading a substrate onto a support table configured to support the substrate, the method comprising: extracting gas from a gap between a base surface of the support table and the substrate via a plurality of gas flow openings in the support table, wherein during a first phase of loading the gas is extracted through at least one gas flow opening in an outer region of the support table and not through any gas flow opening in an intermediate region of the support table radially inward of the outer region and any gas flow opening in a central region of the support table radially inward of the intermediate region, during a second phase of loading the gas is extracted through at least one gas flow opening in the outer region and at least one gas flow opening in the intermediate region and not through any gas flow opening in the central region, and during a third phase of loading the gas is extracted through at least one gas flow opening in the outer region, at least one gas flow opening in the intermediate region and at least one gas flow opening in the central region.

According to an aspect of the invention, there is provided a lithographic apparatus comprising: a gas flow system; a controller configured to control the gas flow system; and a support table configured to support a substrate, wherein the support table comprises: a base surface; a central region; an outer region radially outward of the central region; and a plurality of gas flow openings through which the gas flow system is configured to supply gas to a gap between the base surface and the substrate; and wherein when the substrate is to be unloaded from the support table: during an initial phase of unloading the controller is configured to control the gas flow system to supply the gas through at least one gas flow opening in the outer region and not through any gas flow opening in the central region, and during a subsequent phase of unloading the controller is configured to control the gas flow system to supply the gas through at least one gas flow opening of the outer region and at least one gas flow opening of the central region.

According to an aspect of the invention, there is provided a lithographic apparatus comprising: a gas flow system; a controller configured to control the gas flow system; and a support table configured to support a substrate, wherein the support table comprises: a base surface; a central region; an intermediate region radially outward of the central region; an outer region radially outward of the intermediate region; and a plurality of gas flow openings through which the gas flow system is configured to extract gas from a gap between the base surface and the substrate; wherein when the substrate is being loaded onto the support table: during a first phase of loading the controller is configured to control the gas flow system to extract the gas through at least one gas flow opening in the central region and not through any gas flow opening in the intermediate region and any gas flow opening in the outer region, during a second phase of loading the controller is configured to control the gas flow system to extract the gas through at least one gas flow opening in the central region and at least one gas flow opening in the intermediate region and not through any gas flow opening in the outer region, and during a third phase of loading the controller is configured to control the gas flow system to extract the gas through at least one gas flow opening in the central region, at least one gas flow opening in the intermediate region and at least one gas flow opening in the outer region.

According to an aspect of the invention, there is provided a lithographic apparatus comprising: a gas flow system comprising an underpressure source; a controller configured to control the gas flow system; and a support table configured to support a substrate, wherein when the substrate is being lowered towards the support table, the controller is configured to control the underpressure source to apply an underpressure so as to extract gas from a gap between the support table and the substrate via a plurality of gas flow openings in the support table, when the substrate reaches a predetermined distance above the support table, the controller is configured to control the underpressure source to stop applying an underpressure in fluid communication with any of the gas flow openings in the support table; and when the substrate has touched down onto the support table, the controller is configured to control the underpressure source to restart applying an underpressure so as to extract the gas via the plurality of gas flow openings in the support table.

According to an aspect of the invention, there is provided a lithographic apparatus comprising: a gas flow system; a controller configured to control the gas flow system; and a support table configured to support a substrate, wherein the support table comprises: a base surface; a central region; an intermediate region radially outward of the central region; an outer region radially outward of the intermediate region; and a plurality of gas flow openings through which the gas flow system is configured to extract gas from a gap between the base surface and the substrate; wherein each region is provided with: a flow channel in fluid communication with the gas flow openings in that region; and a pressure sensor configured to sense a pressure relating to that region; wherein when the substrate is being loaded onto the support table the controller is configured to control timing of extracting gas through the gas flow openings in each region based on the sensed pressure of each region.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
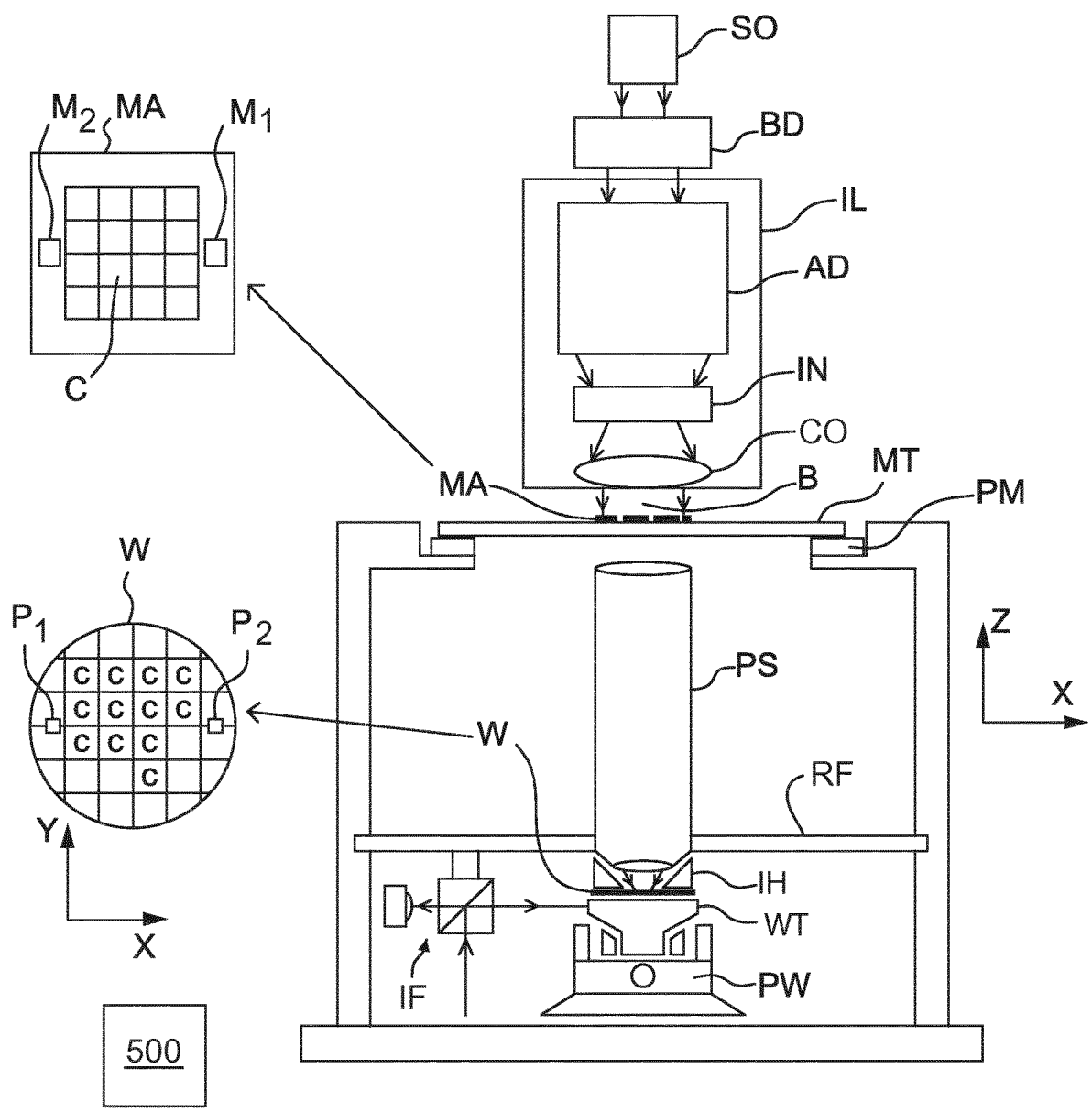
FIG. 1 depicts a lithographic apparatus according to an embodiment of the invention.

FIG. 1 schematically depicts a lithographic apparatus according to one embodiment of the invention. The apparatus comprises:

a. an illumination system (illuminator) IL configured to condition a radiation beam B (e.g. UV radiation or DUV radiation);

b. a support structure (e.g. a mask table) MT constructed to support a patterning device (e.g. a mask) MA and connected to a first positioner PM configured to accurately position the patterning device MA in accordance with certain parameters;

c. a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and d. a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more support tables or a combination of one or more support tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, cleaning, sensor and/or measurement tables.

Referring to FIG. 1, the illumination system IL receives a radiation beam from a source SO or radiation. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam, to have a desired uniformity and intensity distribution in its cross-section. Similar to the source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the support table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks $M_1$, $M_2$ and substrate alignment marks $P_1$, $P_2$. Although the patterning device alignment marks $M_1$, $M_2$ as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the support table WT is submersed in a bath of liquid.

Figure 2:
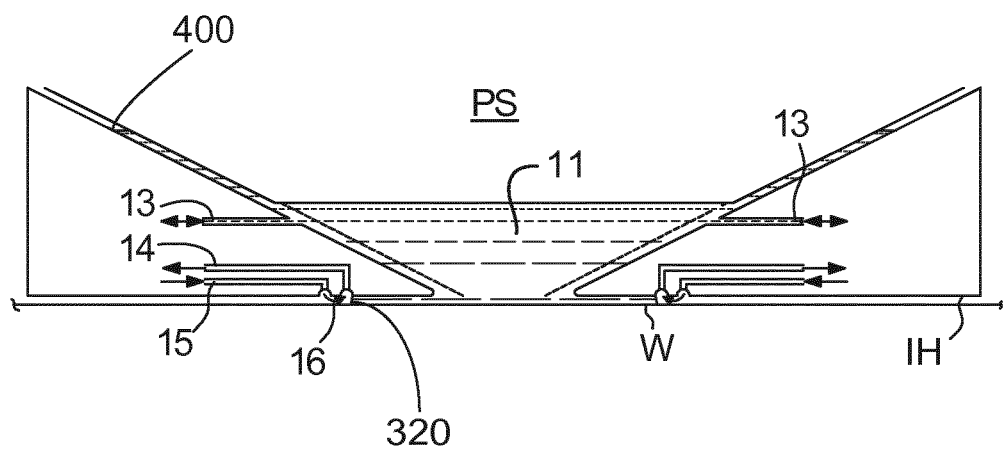
FIG. 2 depicts a liquid supply system for use in a lithographic projection apparatus.
Figure 3:
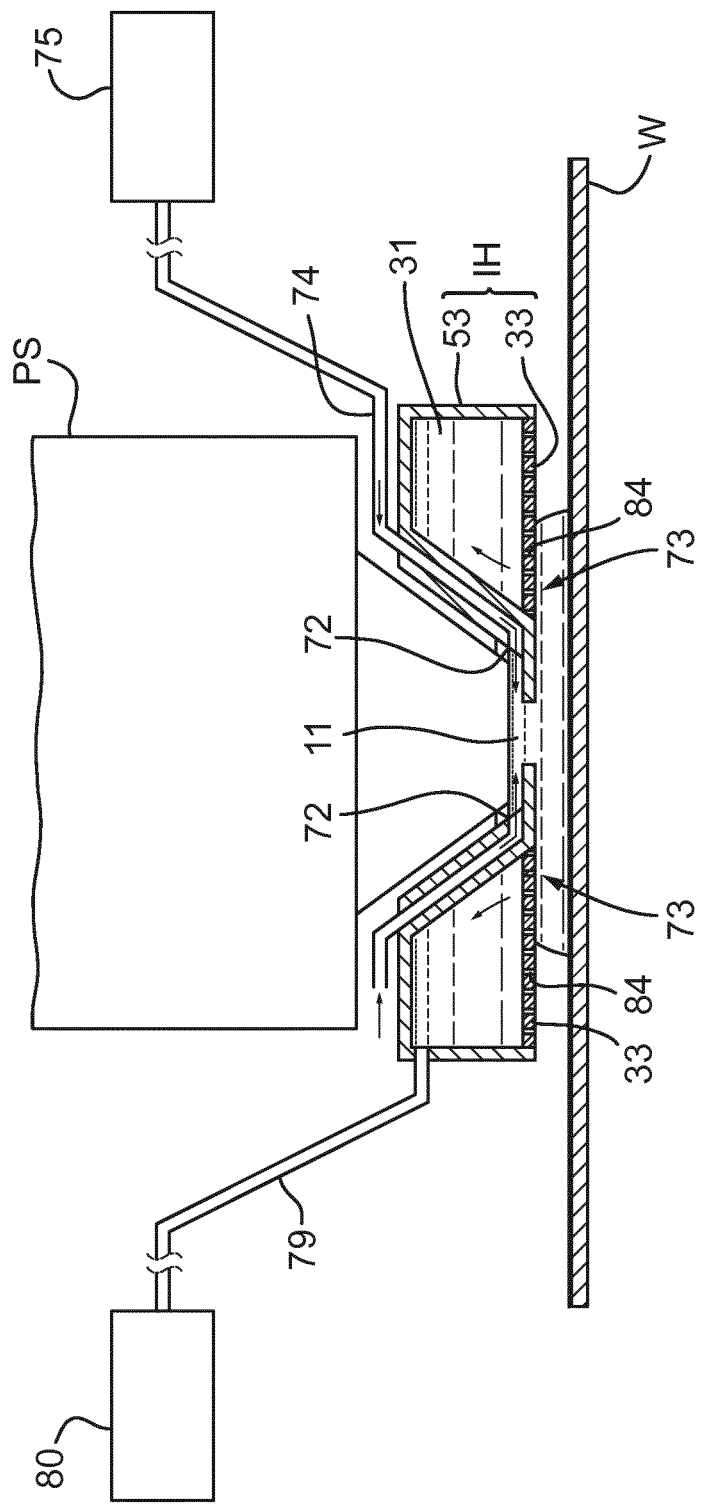
FIG. 3 is a side cross sectional view that depicts a further liquid supply system according to an embodiment.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2 and 3 show different supply devices which can be used in such a system. A sealing feature is present to seal liquid to the localized area. One way which has been proposed to arrange for this is disclosed in PCT patent application publication no. WO 99/49504.

An arrangement which has been proposed is to provide the liquid supply system with a liquid confinement structure which extends along at least a part of a boundary of a space between the final element of the projection system and the support table. Such an arrangement is illustrated in FIG. 2.

FIG. 2 schematically depicts a localized liquid supply system or fluid handling system. The liquid supply system is provided with a fluid handling structure IH (or liquid confinement structure), which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.) The fluid handling structure IH is substantially stationary relative to the projection system PS in the XY plane though there may be some relative movement in the Z direction (in the direction of the optical axis). In an embodiment, a seal is formed between the fluid handling structure IH and the surface of the substrate W and may be a contactless seal such as a gas seal (such a system with a gas seal is disclosed in European patent application publication no. EP-A-1,420,298) or liquid seal.

The fluid handling structure IH at least partly confines liquid in the space 11 between the final element of the projection system PS and the substrate W. A contactless seal to the substrate W may be formed around the image field of the projection system PS so that liquid is confined within the space 11 between the substrate W surface and the final element of the projection system PS. The space 11 is at least partly formed by the fluid handling structure IH positioned below and surrounding the final element of the projection system PS. Liquid is brought into the space 11 below the projection system PS and within the fluid handling structure IH by one of liquid openings 13. The liquid may be removed by another of liquid openings 13. The liquid may be brought into the space 11 through at least two liquid openings 13. Which of liquid openings 13 is used to supply the liquid and optionally which is used to remove the liquid may depend on the direction of motion of the support table WT. The fluid handling structure IH may extend a little above the final element of the projection system PS. The liquid level rises above the final element so that a buffer of liquid is provided. In an embodiment, the fluid handling structure IH has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be confined in the space 11 by a gas seal 16 which, during use, is formed between the bottom of the fluid handling structure IH and the surface of the substrate W. The gas seal 16 is formed by gas. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure IH and the substrate W confines the liquid in the space 11. The inlets/outlets may be annular grooves which surround the space 11. The annular grooves may be continuous or discontinuous. The flow of gas is effective to confine the liquid in the space 11. Such a system is disclosed in United States patent application publication no. U.S. 2004-0207824, which is hereby incorporated by reference in its entirety. In an embodiment, the fluid handling structure IH does not have the gas seal 16.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH (or a liquid confinement structure), which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.)

The fluid handling structure IH at least partly confines liquid in the space 11 between the final element of the projection system PS and the substrate W. The space 11 is at least partly formed by the fluid handling structure IH positioned below and surrounding the final element of the projection system PS. In an embodiment, the fluid handling structure IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in United States patent application publication no. U.S. 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid recovered via the recovery port 73 through the passageway 79. The porous member 33 is disposed in the recovery port 73.

In an embodiment, to form the space 11 with the liquid between the projection system PS and the fluid handling structure IH on one side and the substrate W on the other side, liquid is supplied from the supply ports 72 to the space 11 and the pressure in a recovery chamber 31 in the fluid handling structure IH is adjusted to a negative pressure so as to recover the liquid via the holes 84 (i.e., the recovery port 73) of the porous member 33. Performing the liquid supply operation using the supply ports 72 and the liquid recovery operation using the porous member 33 forms the space 11 between the projection system PS and the fluid handling structure IH on one side and the substrate W on the other side.

As depicted in the Figures, the apparatus may be of an immersion type. Alternatively, the apparatus may be of a dry type in which the substrate is not immersed in a liquid.

Figure 4:
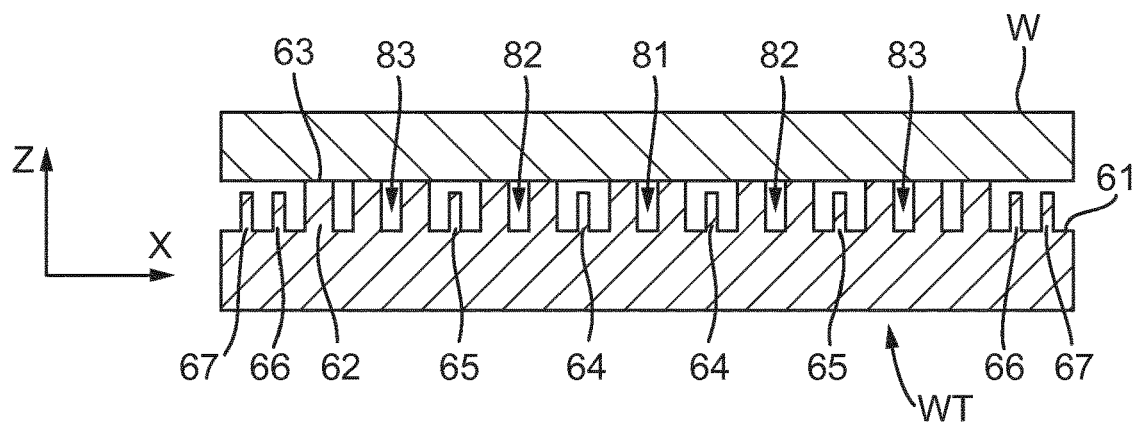
FIG. 4 depicts, in cross-section, a support table for a lithographic apparatus according to an embodiment of the invention.

FIG. 4 depicts, in cross-section, a support table WT for a lithographic apparatus according to an embodiment of the invention. The support table WT is configured to support a substrate W. The lithographic apparatus also comprises a gas flow system that interacts with the support table WT.

The support table WT comprises a base surface 61. In an embodiment the base surface 61 is configured to be substantially parallel to a lower surface of the substrate W supported on the support table WT. In an embodiment the support table WT comprises a plurality of burls 62. The burls 62 protrude above the base surface 61. Each of the plurality of burls 62 has a respective burl distal end 63. The burl distal ends 63 are arranged in a support plane so as to support the substrate W. When the substrate W is supported by the support table WT, the substrate W is supported by the respective burl distal ends 63 of each of the plurality of the burls 62.

In use, the substrate W is supported by the support table WT. When the substrate W is supported by the support table WT, the substrate W is supported by the respective burl distal ends 63 of each of the burls 62.

A gap is defined between the base surface 61 of the support table WT and the substrate W. The width of the gap corresponds to the height of the burl distal ends 63 above the base surface 61.

Figure 7:
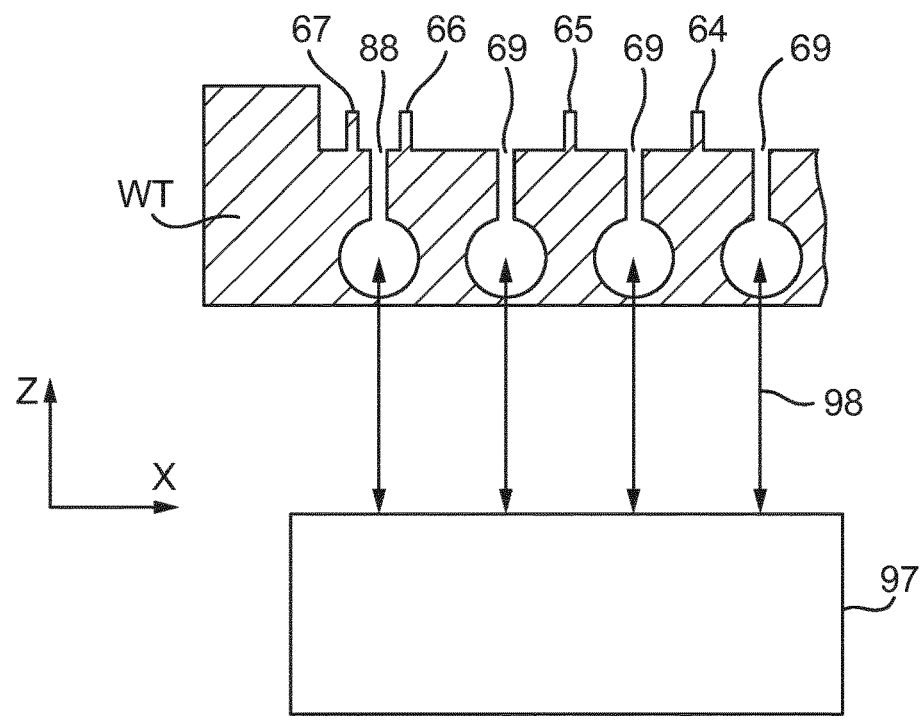
FIG. 7 schematically depicts part of a support table and a gas flow system for a lithographic apparatus according to an embodiment of the invention.

FIG. 7 schematically depicts, in cross-section, part of a support table WT and a gas flow system 97 for a lithographic apparatus according to an embodiment of the invention. The lithographic apparatus comprises the gas flow system 97. The gas flow system 97 interacts with the support table WT. As shown in FIG. 7, in an embodiment the support table WT comprises a plurality of gas flow openings 69. The gas flow openings 69 facilitate clamping of the substrate W. Gas may be extracted through the gas flow openings 69 from the gap enclosed by the substrate W and the support table WT, thereby reducing the pressure in this gap for clamping of the substrate W. In an embodiment an additional two-phase extractor (not shown in FIG. 7) is radially outward of the outer seal 67 in order to extract bubbles of gas and liquid from between the substrate W and the support table WT.

In an embodiment the gas flow system 97 is configured to supply gas through the gas flow openings 69 to the gap between the base surface 61 and the substrate W. In an embodiment the gas flow system 97 is configured to extract gas from the gap between the base surface 61 and the substrate W via the gas flow opening 69. In an embodiment the gas flow system 97 is configured to supply gas to the gap and extract gas from the gap through the gas flow openings 69.

In a method for unloading the substrate W from the support table WT, gas is supplied to the gap between the base surface 61 and the substrate W via the gas flow openings 69 in the support table WT. In an embodiment the method for unloading the substrate W comprises different phases of unloading during which different pressure profile are applied to the gap between the base surface 61 and the substrate W.

There may be two different phases of unloading. In an embodiment the method comprises an initial phase of unloading and a subsequent phase of unloading. The subsequent phase of unloading is after the initial phase of unloading. In an embodiment the subsequent phase of unloading immediately follows the initial phase of unloading. In an alternative embodiment there are three phases of unloading. In an embodiment an intermediate phase of unloading is after the initial phase of unloading and before the subsequent phase of unloading. In an embodiment there are more than three phases of unloading.

In an embodiment, the support table WT comprises a central region 81 and an outer region 83, as shown in FIG. 4. The outer region 83 is radially outward of the central region 81.

During the initial phase of unloading, gas is supplied through at least one gas flow opening 69 in the outer region 83 and not through any gas flow opening in the central region 81. During the subsequent phase of unloading, gas is supplied through at least one gas flow opening 69 in the outer region 83 and also through at least one gas flow opening in the central region 81.

When the substrate W is clamped on the support table WT, a vacuum (or near vacuum pressure) is applied in the central region 81 and the outer region 83. When the substrate W is being unloaded, the vacuum is released in the outer region 83 before the vacuum is released in the central region 81. By first releasing the vacuum on the outer region 83 and then releasing the vacuum on the central region 81 thereafter, the substrate W is expected to be released (or to roll off) from the edge towards the centre. An embodiment of the invention is expected to achieve a reduction in slipping of the substrate W on the burls 62 in the outer region 83 (e.g. at the periphery) of the support table WT. Accordingly, an embodiment of the invention is expected to achieve a reduction in wear of the burls 62 at the outer periphery of the support table WT.

In an embodiment the central region 81 borders onto the outer region 83. However, this is not necessarily the case. For example, as shown in FIG. 4, in an embodiment the support table comprises an intermediate region 82.

As mentioned above, in an embodiment the method comprises an intermediate phase of unloading. In particular this may be the case when the support table WT comprises an intermediate region 82. The intermediate region 82 is radially outward of the central region 81. The intermediate region 82 is radially inward of the outer region 83. In an embodiment the intermediate region 82 borders onto the central region 81. In an embodiment the intermediate region 82 borders onto the outer region 83.

In an embodiment, during the initial phase of unloading, gas is supplied through at least one gas flow opening 69 in the outer region 83 and not through any gas flow opening in the central region 81 and intermediate region 82. During the intermediate phase of unloading, gas is supplied through at least one gas flow opening 69 in the outer region 83 and through at least one gas flow opening 69 in the intermediate region 82 and not through any gas flow opening 69 in the central region 81. During the subsequent phase of unloading (which is after the intermediate phase of unloading), gas is supplied through at least one gas flow opening 69 in the outer region 83, through at least one gas flow opening 69 in the intermediate region 82 and through at least one gas flow opening 69 in the central region 81.

Accordingly, in an embodiment the support table WT comprises three different segments or clamping areas where vacuum can be applied and released at different timings. By providing the additional intermediate region 82 and releasing the vacuum on the outer region 83, then releasing the vacuum at the intermediate region 82 and then releasing the vacuum at the central region 81, an embodiment of the invention is expected to reduce wear of the burls 62. This is because by providing a sequence of releasing the vacuum starting from the outer periphery and ending at the central region 81, the substrate W is expected to be less likely to slip over the burls 62, or to reduce the slipping force. In an embodiment the support table WT comprises more than three different segments or clamping areas, where vacuum can be released at different timings, releasing the vacuum starting from the outer periphery and ending at the central region 81.

In an embodiment the gas flow system 97 is configured to provide a puff of gas (e.g. air) through the gas flow openings 69 before releasing the vacuum. The puff of gas is for helping the substrate W to move away from the burls 62, so as to reduce the chances of slipping. In an embodiment, during the initial phase of unloading, gas is supplied through at least one gas flow opening 69 in the outer region 83 at a first pressure greater than ambient pressure. The gas supplied at a first pressure greater than ambient pressure is the puff of gas that helps the substrate W to move away from the burls 62. Following the puff of gas, gas is supplied through at least one gas flow opening 69 in the outer region 83 at a second pressure less than the first pressure. In an embodiment the second pressure is greater than ambient pressure. Accordingly, when the second pressure is applied, the substrate W does not stick back to the support table WT. In an alternative embodiment the second pressure is less than ambient pressure, such that the vacuum is released after the initial puff of gas. By supplying gas at a second pressure less than the ambient pressure, the vacuum is gradually released in the outer region 83. Accordingly, the releasing of the vacuum of the outer region 83 can be preceded by the puff of gas. By supplying gas at a first pressure greater than ambient pressure, the possibility of a warped substrate W undesirably contacting the burls 62 during the unloading process is reduced. Typically if a substrate W is warped, then the substrate W is warped at its edges. Accordingly, the substrate W is at greatest danger of undesirably contacting the burls 62 at the outer region 83 during the unloading process.

In an embodiment, gas may be supplied at a first pressure greater than ambient pressure in any of the outer region 83, the intermediate region 82 and the central region 81. For example, in an embodiment during the intermediate phase of unloading, gas is supplied through at least one gas flow opening 69 in the intermediate region 82 at a first pressure greater than ambient pressure, following which gas is supplied through at least one gas flow opening 69 in the intermediate region 82 at a second pressure less than the first pressure.

In an embodiment, during the subsequent phase of unloading, gas is supplied through at least one gas flow opening 69 in the central region 81 at a first pressure greater than ambient pressure, following which gas is supplied through at least one gas flow opening 69 in the central region 81 at a second pressure less than the first pressure. Hence, for each region, a puff may be added before releasing the vacuum. This reduces the slipping force of the substrate W over the burls 62 or reduces the chances of the substrate W slipping over the burls 62, thereby reducing wear at the burls 62.

The invention has been described above in the context of a method for unloading the substrate W from the support table WT. The invention is equally applicable to methods for loading the substrate W onto the support table WT.

According to a method for loading the substrate W onto the support table WT, the method comprises extracting gas from the gap via a plurality of gas flow openings 69 in the support table WT. The method for loading the substrate W comprises at least three phases of loading. There may be more than three phases.

During the first phase of loading, gas is extracted through at least one gas flow opening 69 in the central region 81 and not through any gas flow opening 69 in the intermediate region 82 and the outer region 83. Then, during the second phase of loading, gas is extracted through at least one gas flow opening 69 in the central region 81 and at least one gas flow opening 69 in the intermediate region 82 and not through any gas flow opening 69 in the outer region 83. Then, during the third phase of loading, gas is extracted through at least one gas flow opening 69 in the central region 81, at least one gas flow opening 69 in the intermediate region 82 and at least one gas flow opening 69 in the outer region 83.

Accordingly, the vacuum may be applied first in the central region 81, then in the intermediate region and thereafter in the outer region 83. An embodiment of the invention is expected to achieve a reduction in grid deformation remaining after loading of the substrate W. Any deformation of the substrate W can lead to larger overlay errors. For example, deformation of the substrate W can reduce the accuracy of radiation incident on the substrate W. It may be that a curvature in the surface of the substrate W causes radiation to contact the substrate W slightly off-target. In particular, if the substrate W is clamped to the burls 62 first at the outer periphery of the support table WT, then any deformation in the substrate W may remain when the substrate W is clamped. By applying the vacuum firstly at the central region 81 and finally at the outer region 83, it is expected that the substrate W will be clamped to the burls 62 starting in the central region 81. This is expected to reduce the deformation of the substrate W when it is loaded onto the support table WT. In an embodiment the support table WT comprises more than three regions. During loading, a vacuum is applied firstly at the centre-most region and finally at the outermost region.

As explained above, gas may be supplied in the same region over different phases of unloading. For example, gas is supplied in the central region 81 for the initial phase of unloading, the intermediate phase of unloading and the subsequent phase of unloading. It may be that the gas flow openings 69 used to supply the gas in the different phases are the same gas flow openings 69. Alternatively, different gas flow openings 69 may be used for the different phases within a particular region.

Similarly, during a loading process, gas may be extracted in one region for different phases of the loading process. For example, gas is extracted at the central region 81 during each of the first phase, second phase and third phase of loading. It may be that the gas flow openings 69 used for a particular region during different phases may be the same gas flow openings 69. Alternatively, different gas flow openings may be used for different phases for a particular region.

In an embodiment, gas may be supplied through gas flow openings 69 during a loading process. This is to prevent warped substrate W from undesirably touching the burls 62, particularly at the outer periphery of the support table WT. In an embodiment, during the first phase of loading, gas at a pressure greater than ambient pressure is supplied through at least one gas flow opening 69 in the intermediate region 82 and/or through at least one gas flow opening 69 in the outer region 83. Accordingly, while a vacuum is being created in the central region 81, a puff of gas is being supplied in the intermediate region 82 and the outer region 83. This prevents the substrate W from undesirably touching the burls 62 in the intermediate region 82 or the outer region 83 before the substrate W contacts the burls 62 in the central region 81.

In an embodiment, during the second phase of loading, gas is supplied through at least one gas flow opening 69 in the outer region 83 at a pressure greater than ambient pressure. Accordingly, a puff of gas can be provided in the outer region 83 even when the vacuum is being created in the intermediate region 82.

As described above, in an embodiment, vacuum is applied on the central region 81 first, then on the intermediate region 82, and then on the outer region 83. However, in an alternative embodiment, the loading sequence is reversed. In an embodiment, during the first phase of loading the gas is extracted through at least one gas flow opening 69 in the outer region 83 of the support table WT and not through any gas flow opening 69 in the intermediate region 82 of the support table WT and any gas flow opening 69 in the central region 81 of the support table WT. During the second phase of loading the gas is extracted through at least one gas flow opening 69 in the outer region 83 and at least one gas flow opening 69 in the intermediate region 82 and not through any gas flow opening 69 in the central region 81. During the third phase of loading the gas is extracted through at least one gas flow opening 69 in the outer region 83, at least one gas flow opening 69 in the intermediate region 82 and at least one gas flow opening 69 in the central region 81.

This embodiment of the invention is expected to be better for clamping warped substrates W that have a bowl-shape (i.e. where the outer periphery of the substrate W is raised above the central part of the substrate W).

In an embodiment, a flow of gas between the central region 81 and the intermediate region 82 is restricted. By restricting the flow of gas between the central region 81 and the intermediate region 82, gas can be extracted from or supplied to the gap for each of the central region 81 and the intermediate region 82 substantially independently.

For example, FIG. 4 shows a central region wall 64. The central region wall 64 protrudes above the base surface 61. The central region wall 64 restricts the flow of gas between the intermediate region 82 and the central region 81. In an embodiment the central region wall 64 is configured to restrict the flow of gas between the central region 81 and the intermediate region 82. The top of the central region wall 64 does not come into contact with the substrate W when the substrate W is clamped on the support table WT. The central region wall 64 functions as a seal. The central region wall 64 is not as high as the burls 62. There is a small gap between the substrate W and the top of the central region wall 64.

Figure 5:
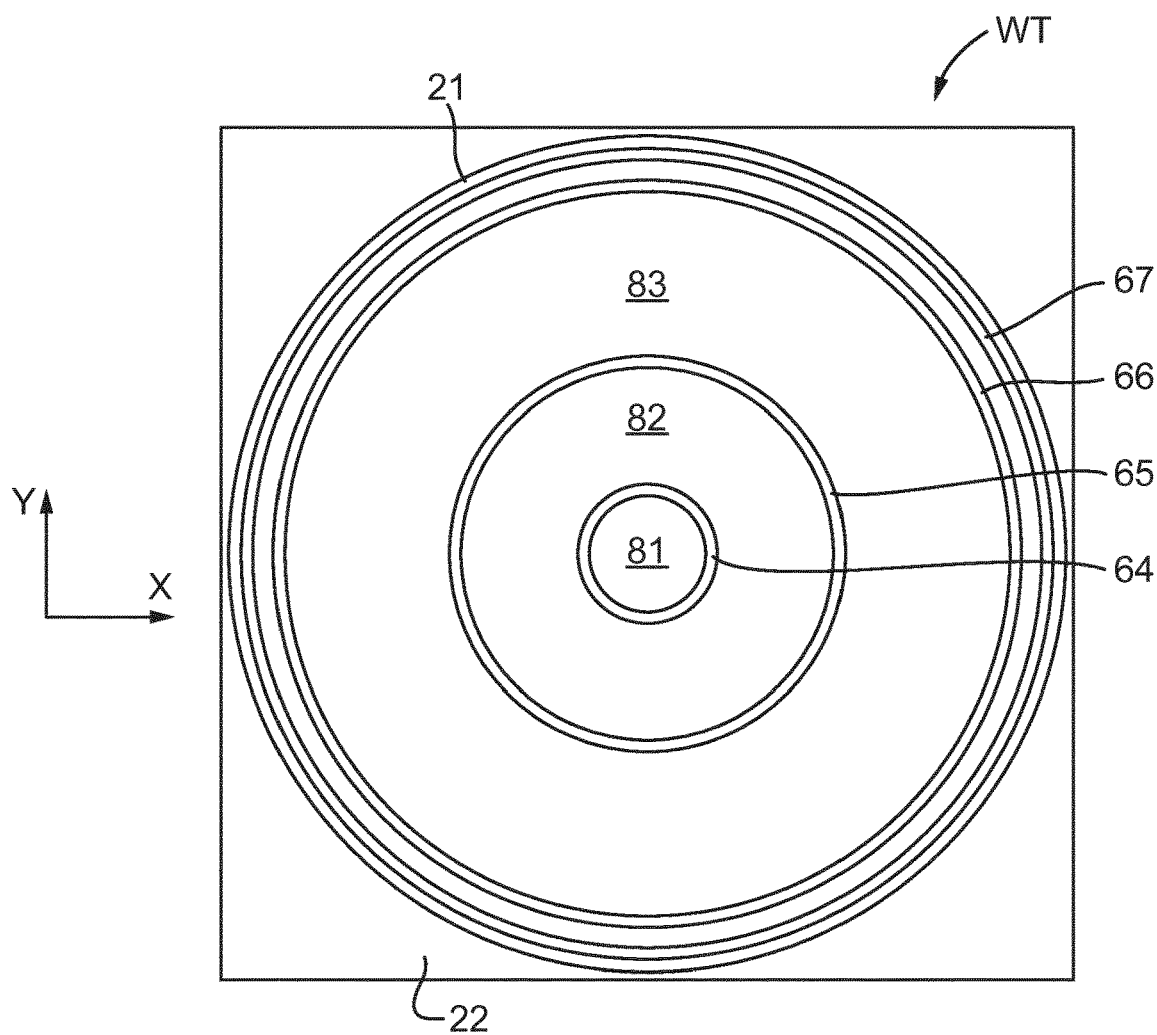
FIG. 5 depicts, in plan, a support table for a lithographic apparatus according to an embodiment of the invention.

FIG. 5 depicts, in plan, the support table WT shown in FIG. 4. Burls 62 have been omitted from FIG. 5 for simplicity. In an embodiment the central region wall 64 is continuous. The central region wall 64 does not have any breaks through which gas could flow between the intermediate region 82 and the central region 81. As depicted in FIG. 5, in an embodiment the central region wall 64 forms a circular shape in plan view. However, other shapes are also possible. For example, the central region wall 64 could form a square or a rectangle.

As depicted in FIG. 5, in an embodiment the intermediate region 82 surrounds the central region 81. The intermediate region 82 surrounds the central region 81 in plan view. As depicted in FIG. 5, in an embodiment the intermediate region 82 is defined at its radially outer periphery by an intermediate region wall 65. The intermediate region wall 65 protrudes above the base surface 61. The intermediate region wall 65 is configured to restrict a flow of gas between the intermediate region 82 and the outer region 83. This allows gas to be supplied to or extracted from the gap for each of the intermediate region 82 and the outer region 83 substantially independently. The intermediate region wall 65 functions as a seal. The intermediate region wall 65 is not as high as the burls 62. There is a small gap between the substrate W and the top of the intermediate region wall 65.

By allowing a substantially independent flow of gas for each of the regions, the loading and unloading processes can be controlled more accurately. As depicted in FIG. 5, in an embodiment the outer region 83 surrounds the intermediate region 82. The outer region 83 surrounds the intermediate region 82 in plan view.

As depicted in FIG. 5, in an embodiment the outer region 83 is defined at its radially outer periphery by an outer region wall 66. The outer region wall 66 protrudes above the base surface 61. The outer region wall 66 is configured to restrict a flow of gas between the outer region 83 and a region radially outward of the outer region 83. The outer region wall 66 functions as a seal. The outer region wall 66 is not as high as the burls 62. There is a small gap between the substrate W and the top of the outer region wall 66.

In an embodiment the support table WT comprises one or more outer seals 67. The outer region wall 66 and the outer seal 67 may form a double seal. The double seal may be for a water extraction system. For example, a fluid extraction opening 88 (see FIG. 7) may be provided for extracting liquid (and also gas) from the space between the outer region wall 66 and the outer seal 67.

In an embodiment each region has its own gas suction channel. This means that the gas pressure in each region can be controlled individually. In an embodiment the gas flow system 97 comprises a flow channel 98 for each region. For example, in an embodiment the gas flow system 97 comprises a central flow channel connected to the at least one gas flow opening 69 in the central region 81, an intermediate flow channel connected to the at least one gas flow opening 69 in the intermediate region 82 and an outer flow channel connected to the at least one gas flow opening in the outer region 83. The central flow channel, the intermediate flow channel and the outer flow channel are independent from each other. The central flow channel, the intermediate flow channel and the outer flow channel are depicted in FIG. 7 as double ended arrows.

Figure 6:
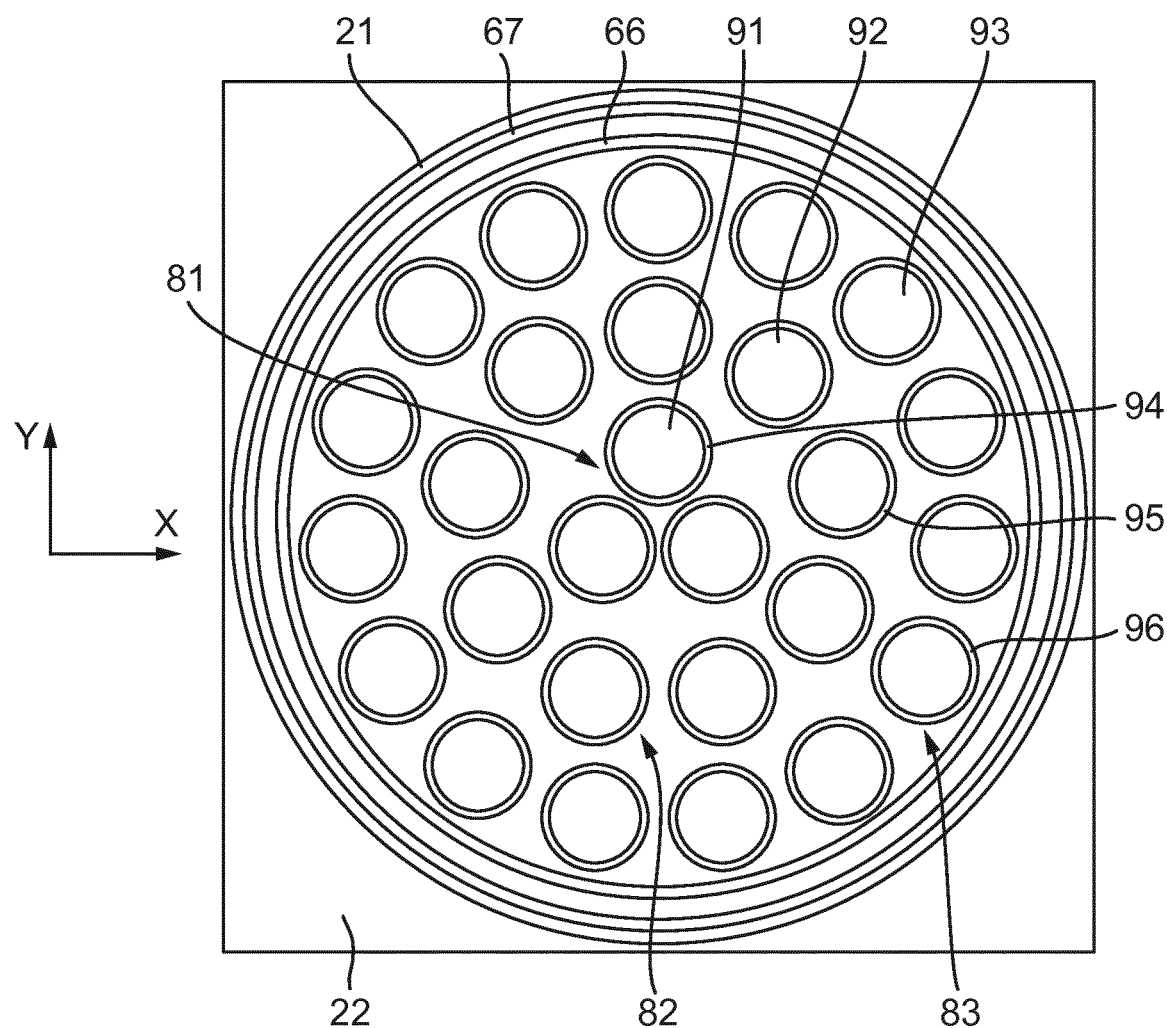
FIG. 6 depicts, in plan, a support table for a lithographic apparatus according to another embodiment of the invention.

FIG. 6 depicts, in plan, a support table WT that is an alternative to the support table WT shown in FIG. 5. However, the functionality of the invention is substantially the same for the embodiment shown in FIG. 6 as for the embodiment shown in FIG. 5. Burls 62 have been omitted from FIG. 6 for simplicity.

As shown in FIG. 6, in an embodiment the central region 81 comprises a plurality of non-overlapping central sub-regions 91. Each central sub-region 91 is defined by a central sub-region wall 94. Each central sub-region wall 94 protrudes above the base surface 61. Each central sub-region wall 94 is configured to restrict a flow of gas between the central region 81 and any other region (e.g. the outer region 83 or the intermediate region 82). This allows gas to be supplied to or extracted from the gap for the central region 81 substantially independently from the other regions. Each central sub-region wall 94 functions as a seal. Each central sub-region wall 94 is not as high as the burls 62. There is a small gap between the substrate W and the top of each central sub-region wall 94.

As depicted in FIG. 6, in an embodiment the central sub-regions 91 are spaced from each other. The central sub-region walls 94 of adjacent central sub-regions 91 are separate and do not contact each other. This means that there is space between the central sub-regions 91 (i.e. outside of the central sub-region walls 94) that does not belong to any of the central region 81, intermediate region 82 or outer region 83. Accordingly, it is not necessary for the intermediate region 82 or outer region 83 to completely surround the central region 81.

Alternatively, adjacent central sub-regions 91 may border onto each other. A central sub-region wall 94 could be shared by adjacent central sub-regions 91. This means that a central sub-region wall 94 may be the dividing line between adjacent central sub-regions 91. One central sub-region 91 may be on one side of the central sub-region wall 94, with another central sub-region 91 on the other side of the central sub-region wall 94.

As depicted in FIG. 6, the intermediate region 82 and the central region 83 may be arranged similarly to the central region 81. In particular, the invention may be implemented by using islands of seals (formed by the sub-region walls). The sub-regions may be called islands of seals because in plan view the sub-regions can appear as islands defined at their edges by seals (i.e. sub-region walls). In particular, in an embodiment the intermediate region 82 comprises a plurality of non-overlapping intermediate sub-regions 92. Each intermediate sub-region 92 is defined by an intermediate sub-region wall 95. Each intermediate sub-region wall 95 protrudes above the base surface 61. Each intermediate sub-region wall 95 is configured to restrict a flow of gas between the intermediate region 82 and any other region. This then means that gas can be supplied to or extracted from the gap for the intermediate region 82 substantially independently of the other regions. Each intermediate sub-region wall 95 functions as a seal. Each intermediate sub-region wall 95 is not as high as the burls 62. There is a small gap between the substrate W and the top of each intermediate sub-region wall 95.

As depicted in FIG. 6, in an embodiment the intermediate sub-regions 92 are spaced from each other. However, this is not necessarily the case. In an embodiment the intermediate sub-regions 92 are immediately adjacent to each other, with no space between them. For example, the intermediate sub-region wall 95 of one intermediate sub-region 92 may be merged with the intermediate sub-region wall 95 of an adjacent intermediate sub-region 92, such that there is no space between the adjacent intermediate sub-regions 92.

As shown in FIG. 6, in an embodiment the outer region 83 comprises a plurality of non-overlapping outer sub-regions 93 between which a flow of gas is restricted. Each outer sub-region 93 is defined by an outer sub-region wall 96. Each sub-region wall 96 protrudes above the base surface 61. The outer region 83 consists of the outer sub-regions 93. The spaces between the outer sub-regions 93 (through which gas can flow freely) do not form part of the outer region 83. Each outer sub-region wall 96 is configured to restrict a flow of gas between the outer region 83 and any other region. This means that gas can be supplied to or extracted from the outer region 83 substantially independently from any other region. Each outer sub-region wall 96 functions as a seal. Each outer sub-region wall 96 is not as high as the burls 62. There is a small gap between the substrate W and the top of each outer sub-region wall 96.

As depicted in FIG. 6, in an embodiment the outer sub-regions 93 are spaced from each other. However, this is not necessarily the case. In an alternative embodiment the outer sub-regions 93 are immediately adjacent to each other, with no space between them.

FIG. 5 shows concentric regions of the support table WT. In contrast, FIG. 6 shows regions formed by using islands of seals (formed by the sub-region walls). In an embodiment, at least one of the regions may be formed in the manner shown in FIG. 5 and at least one of the regions may be formed in the manner shown in FIG. 6. For example, in an embodiment the central region 81 is formed from central sub-regions 91 as shown in FIG. 6, while the outer region 83 is defined by the intermediate region wall 65 and the outer region wall 66. Further combinations of the embodiments shown in FIGS. 5 and 6 are also possible.

As described above and shown in FIGS. 5 to 7, for example, in an embodiment the different regions of the support table WT are separated from each other by walls. However, it is not essential to provide the walls. In an alternative embodiment, the walls are not provided.

Figure 13:
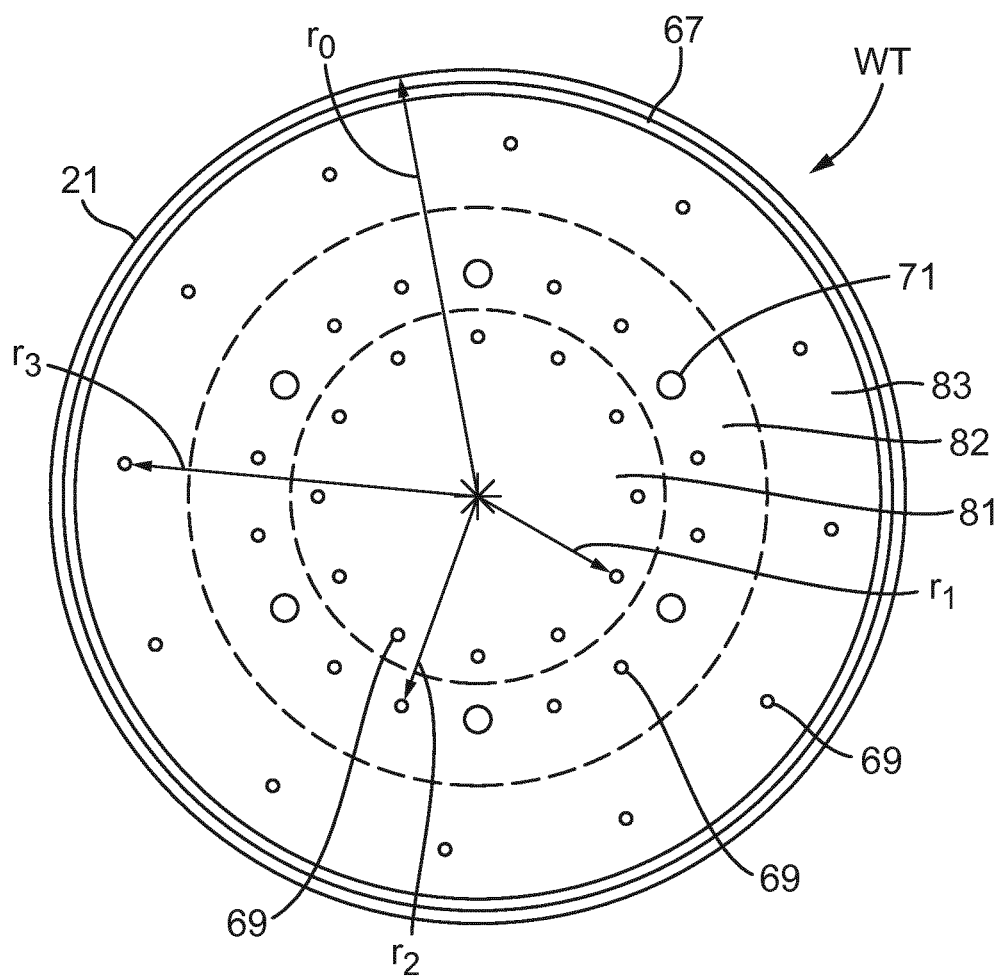
FIG. 13 depicts, in plan, a support table for a lithographic apparatus according to an embodiment of the invention.

FIG. 13 schematically depicts, in plan view, a support table WT according to an embodiment of the invention. In an embodiment the support table WT comprises a plurality of independently controllable flow channels 98 (see FIG. 9) each connected to gas flow openings 69 in different regions of the support table WT. FIG. 13 shows three sets of gas flow openings 69. Each set of gas flow openings 69 is in fluid communication with a flow channel 98. The flow channels 98 are independently controllable of each other. This makes it possible to control the pressure for each set of gas flow openings 69 independently of each other.

Each set of gas flow openings 69 comprises a plurality of gas flow openings 69. As depicted in FIG. 13, in an embodiment the gas flow openings 69 of a set are provided in a ring-shape. Other arrangements are also possible, such as a square-shape or a diamond-shape. As depicted in FIG. 13, in an embodiment each set has 12 gas flow openings 69. However, the number of gas flow openings 69 in each set is not particularly limited and may be six, ten or 16, for example.

Each set of gas flow openings 69 is provided at a different radial distance from the centre of the support table WT. FIG. 13 shows an arrangement in which a first set of gas flow openings 69 is positioned a radial distance $r_1$ from the centre of the support table WT. A second set of gas flow openings 69 is positioned a radial distance $r_2$ from the centre of the support table WT. A third set of gas flow openings 69 is positioned a radial distance $r_3$ from the centre of the support table WT. In FIG. 13, a dashed line represents the boundary between the central region 81 and the intermediate region 82 of the support table. Another dashed line represents the boundary between the intermediate region 82 and the outer region 83 of the support table. As depicted in FIG. 13, the first set of gas flow openings 69 is provided in the central region 81 of the support table WT. The second set of gas flow openings 69 is provided in the intermediate region 82 of the support table WT. The third set of gas flow openings 69 is provided in the outer region 83 of the support table WT.

The flow through each set of gas flow openings 69 can be controlled to provide loading or unloading sequences as described above. For example, in an embodiment gas is extracted initially through the first set of gas flow openings 69, then additionally through the second set of gas flow openings 69 and then additionally through the third set of gas flow openings 69. The number of sets of gas flow openings 69 is not particularly limited and may be two, four or more, for example.

FIG. 13 primarily shows the burl plate 21 of the support table WT (see FIGS. 5 and 6 for the distinction between the burl plate 21 and the chuck 22 of the support table WT). As depicted in FIG. 13, the burl plate 21 has a radius of $r_0$. In an embodiment, the first set of gas flow openings 69 is arranged such that $r_1:r_0$ is at least 0.2. In an embodiment, the first set of gas flow openings 69 is arranged such that $r_1:r_0$ is at most 0.5. In an embodiment, the first set of gas flow openings 69 is arranged such that $r_1:r_0$ is at about 0.4.

In an embodiment, the second set of gas flow openings 69 is arranged such that $r_2:r_0$ is at least 0.5. In an embodiment, the second set of gas flow openings 69 is arranged such that $r_2:r_0$ is at most 0.8. In an embodiment, the second set of gas flow openings 69 is arranged such that $r_2:r_0$ is at about 0.6.

In an embodiment, the third set of gas flow openings 69 is arranged such that $r_3:r_0$ is at least 0.5. In an embodiment, the third set of gas flow openings 69 is arranged such that $r_3:r_0$ is at most 0.95. In an embodiment, the third set of gas flow openings 69 is arranged such that $r_3:r_0$ is at about 0.9.

As indicated above, other arrangements of the gas flow openings 69 are also possible, such as a square-shape or a diamond-shape. Any of the walls described may be provided for other configurations, such as a non-radial opening configuration. This may be useful because the substrate W may not warp symmetrically, or rotationally symmetrically, for example, the substrate W may warp in a saddle shape.

As depicted in FIG. 13, although the walls depicted in FIG. 5 are not provided between the sets of gas flow openings 69, in an embodiment the support table comprises the outer seal 67.

As depicted in FIG. 13, in an embodiment the support table WT comprises a plurality of pin holes 71. Six pin holes 71 are depicted in FIG. 13, however, any appropriate number of pin holes 71 may be used, i.e. the number of pin holes 71 is not limited to six. The pin holes 71 allow the pins 70 (shown in FIG. 12 and described below) to extend vertically through the support table WT. In an embodiment one of the sets of gas flow openings WT is provided at substantially the same radial distance from the centre of the support table WT as the pin holes 71. In the arrangement shown in FIG. 13, the second set of gas flow openings 69 and the pin holes 71 are provided a radial distance $r_2$ from the centre of the support table WT.

Figure 8:
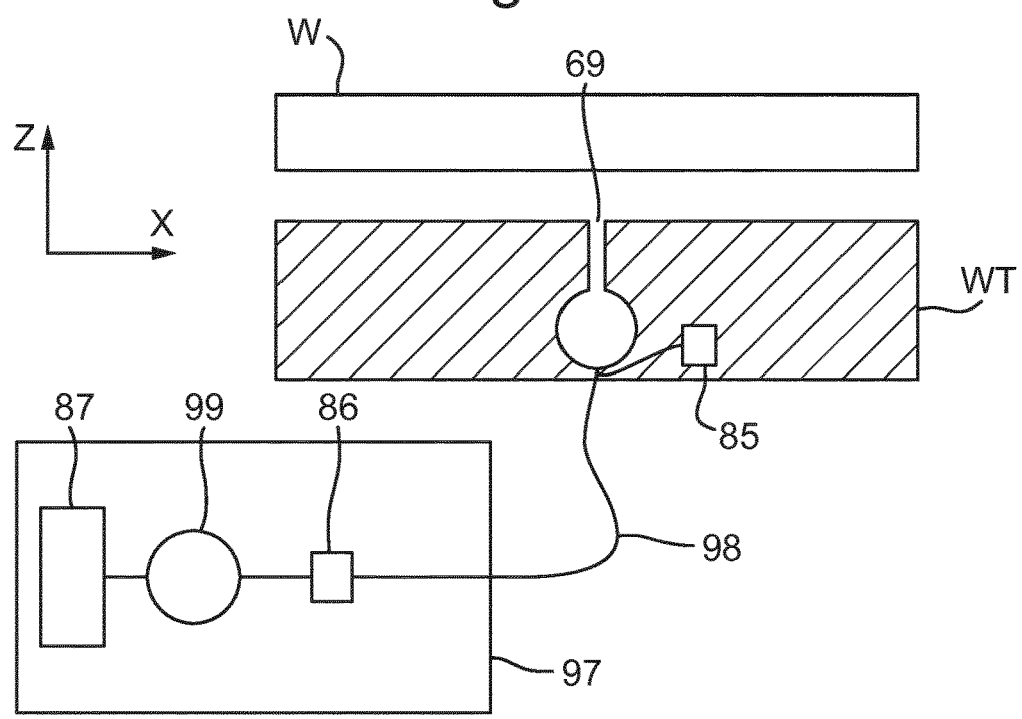
FIG. 8 schematically depicts a support table and a gas flow system for a lithographic apparatus according to an embodiment of the invention.

FIG. 8 schematically depicts a support table WT and a gas flow system 97 according to an embodiment of the invention. FIG. 8 shows a flow channel 98 of the gas flow system 97. The flow channel 98 is in fluid communication with a gas flow opening 69 of the support table WT. FIG. 8 shows only one flow channel 98, merely as an example. The gas flow system 97 comprises a plurality of flow channels 98 so as to control the application and release of vacuums for each of the regions of the support table WT independently.

As depicted in FIG. 8, in an embodiment the gas flow system 97 comprises at least one piezoelectric valve 99. The piezoelectric valve 99 is configured to vary a flow rate through the flow channel 98, which may be the central flow channel, the intermediate flow channel or the outer flow channel. However, it is not necessary for a piezoelectric valve to be used. Other valves can also be used to vary the flow rate. For example, a solenoid valve could be used.

In an embodiment the piezoelectric valve 99 is used for controlling the pressure and flow during a substrate loading sequence and/or a substrate unloading sequence. The use of a piezoelectric valve 99 is expected to make it easier to prepare loading/unloading sequences for different purposes. For example, the sequence may be dependent on the type of layer being formed on the substrate W during the exposure operation. This allows a reduction in the grid error of the substrate W during the substrate loading process.

By providing a variable valve such as the piezoelectric valve 99, a closed loop feedback control can be used to improve the loading sequence for any shape of substrate W. For example, in an embodiment the support table WT comprises at least one pressure sensor 85. The pressure sensor 85 is configured to sense a pressure near the substrate W. For example, pressure sensor 85 is configured to sense the pressure of the flow channel 98 as depicted in FIG. 8. Alternatively, the pressure sensor may be located elsewhere. The pressure sensor 85 may be configured to sense a pressure between the support table WT and the substrate W. In an embodiment the controller of the gas flow system 97 is configured to vary a flow rate through the flow channel 98 based on the pressure sensed by the pressure sensor 85.

In an embodiment the gas flow system 97 comprises a valve pressure sensor 86. The valve pressure sensor 86 is configured to sense the pressure in the flow channel 98 close to the piezoelectric valve 99. In an embodiment the gas flow system 97 comprises an underpressure source 87. The underpressure source 87 may be, for example, a vacuum generator.

In an embodiment the pressure sensor 85 is as close as possible to the substrate W. For example, the pressure sensor 85 is part of the substrate table WT. In an embodiment the support table WT comprises a chuck 22 and a burl plate 21 (e.g. see FIGS. 5 and 6). The burl plate 21 comprises the base surface 61 and the burls 62. The burl plate 21 is fitted onto the chuck 22. In an embodiment the pressure sensor 85 is provided on the burl plate 21 so that it is as close as possible to the substrate W. This helps to better measure what is happening at the substrate W. The valve pressure sensor 86 is provided close to the outlet of the piezoelectric valve 99. The valve pressure sensor 86 can be used to keep the control stable.

The relationship between the setting of the piezoelectric valve 99 and the pressure response at the substrate W can be measured by the pressure sensor 85. This measurement can be used as a feed-forward correction for the next substrate W, particularly if the deformation (e.g. warpage) is comparable for all of the substrates in the batch of substrates.

The piezoelectric valve 99 (or any other type of valve) can be controlled based on output from the pressure sensor 85. A pressure sensor 85 may be provided for each region in the support table WT, so as to provide feedback. By using the pressure sensor 85 in combination with the piezoelectric valve 99 (or any other type of valve), the loading/unloading sequence can be made to be more robust.

In an embodiment the gas flow system 97 comprises a mass-flow controller for each region of the support table WT. Each mass-flow controller is configured to measure and control the flow of gas through the flow channel 98 associated with one of the central region 81, the intermediate region 82 and the outer region 83.

In an embodiment each region is provided with a flow channel 98 and a pressure sensor 85. The flow channel 98 is in fluid communication with the gas flow openings 69 in that region. The pressure sensor 85 is configured to sense a pressure relating to that region, i.e. to the central region 81, the intermediate region 82, or the outer region 83. This may include sensing a pressure between the substrate W and the support table WT in that region, and/or sensing a pressure of the flow channel 98. This makes it possible to determine the suction flow for each region independently such that an optimal pressure-profile in time could be applied per region. Measuring the pressure between the substrate W and the support table WT may be beneficial in that it may be more accurate with respect to the pressure affecting the substrate W and so can be used as a parameter to more accurately control the clamping.

In an embodiment, when the substrate W is being loaded onto the support table WT the controller 500 is configured to control timing of extracting gas through the gas flow openings 69 in each region based on the sensed pressure of each flow channel 98.

An embodiment of the invention is expected to achieve an improved load sequence without needing to know in advance the warpage of the substrate W. By determining the suction flow for each region, the controller 500 can automatically determine the optimal loading sequence. For example, the controller 500 can determine a sequence in which the vacuum is turned on starting from the central region 81 or alternatively starting from the outer region 83.

Figure 9:
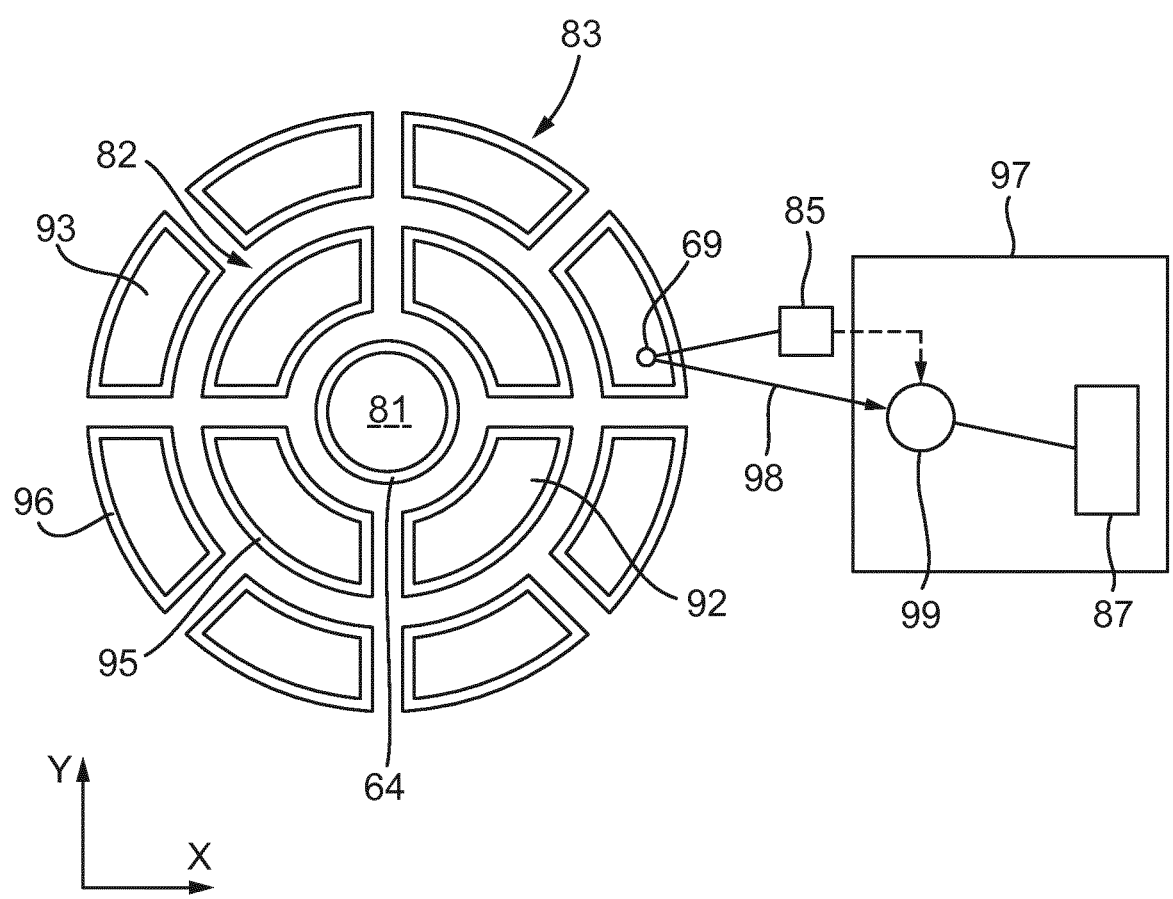
FIG. 9 schematically depicts a support table and a gas flow system for a lithographic apparatus according to an embodiment of the invention.

FIG. 9 schematically depicts an arrangement of regions of a support table WT in conjunction with a gas flow system 97 according to an embodiment of the invention. The arrangement of regions shown in FIG. 9 is an example of a hybrid between the concentric rings arrangement of FIG. 5 and the island seals arrangement of FIG. 6. In the arrangement of FIG. 9, the central region 81 is defined by a central region wall 64, similar to the manner shown in FIG. 5 and described above. Meanwhile, the intermediate region 82 comprises a plurality of intermediate sub-regions 92 defined by intermediate sub-region walls 95, similar to the arrangement shown in FIG. 6 and described above. The outer region 83 comprises a plurality of outer sub-regions 93 defined by outer sub-region walls 96, similar to the arrangement shown in FIG. 6 and described above.

FIG. 9 is an example of seal islands (i.e. sub-regions) that are not circular. Instead, the intermediate sub-regions 92 and the outer sub-regions 93 have the shape of a segment of an annulus. In the arrangement shown in FIG. 9, each intermediate sub-region 92 corresponds to a quadrant of an annulus. There are four intermediate sub-regions 92. However, the number of intermediate sub-regions 92 can be less than four or more than four. As shown in FIG. 9, in an embodiment the support table WT comprises eight outer sub-regions 93, each corresponding to half of a quadrant of an annulus. However, the number of outer sub-regions 93 can be less than eight or more than eight.

As explained above, in an embodiment the vacuum pressures can be controlled substantially independently for regions at different radial positions (i.e. different distances from the centre of the support table WT). The support table WT has a radial degree of freedom for controlling the clamping pressures.

In an embodiment the lithographic apparatus has a tangential (or rotational) degree of freedom for controlling the clamping pressures. In particular, in an embodiment the clamping pressure for different sub-regions (at different tangential positions) of the same region can be controlled independently. For example, in an embodiment a flow of gas between the intermediate sub-regions 92 is restricted such that gas can be extracted from or supplied to the gap for each of the intermediate sub-regions 92 substantially independently.

As depicted in FIG. 9, in an embodiment at least one of the regions comprises a plurality of tangentially distributed sub-regions. Each sub-region is provided with a flow channel 98 and a pressure sensor 85. The flow channel 98 is in fluid communication with the gas flow openings 69 in that sub-region. The pressure sensor 85 is configured to sense a pressure relating to the sub-region, for example, the pressure sensor 85 may be configured to sense a pressure between the support table WT and the substrate W in that sub-region, or the pressure of the flow channel 98.

When the substrate W is being loaded onto the support table WT the controller 500 is configured to control timing of extracting gas through the gas flow openings 69 in each sub-region based on the sensed pressure of each flow channel 98. The controller 500 can determine the optimal loading sequence, independently controlling sub-regions at different tangential positions. This can be particularly useful when clamping a substrate W that is warped in such a way that varies tangentially.

In an embodiment, the flow of gas between the intermediate sub-regions 92 is restricted by the intermediate sub-region walls 95. In an embodiment a flow of gas is restricted between the outer sub-regions 93 such that gas can be extracted from or supplied to the gap for each of the outer sub-regions 93 substantially independently. For example, the gas flow between the outer sub-regions can be restricted by the outer sub-region walls 96.

In an embodiment in which the central region 81 comprises a plurality of non-overlapping central sub-regions 91, a flow of gas between the central sub-regions 91 may be restricted such that gas can be extracted from or supplied to the gap for each of the central sub-regions 91 substantially independently. For example, the gas flow may be restricted by the central sub-region walls 94.

In an embodiment the gas flow system 97 comprises a separate flow channel 98 for each sub-region within a region of the support table WT. FIG. 9 schematically depicts a flow channel 98 connected to the at least one gas flow opening 69 in one of the outer sub-regions 93. This is merely representative of a flow channel 98 for a sub-region. A separate flow channel 98 may be provided for each of the outer sub-regions 93. Similarly, a separate flow channel 98 may be provided for each of the intermediate sub-regions 92. If the central region 81 comprises a plurality of central sub-regions 91, then a separate flow channel 98 may be provided for each of the central sub-regions 91. The flow channels 98 are independent from each other.

As depicted in FIG. 9, in an embodiment a pressure sensor 85 is associated with an outer sub-region 93. The pressure sensor 85 is configured to sense the pressure in the outer sub-region 93. Accordingly, the pressure sensor 85 provides a measure of the clamping pressure in the gap between the base surface 61 and the substrate W within the outer sub-region 93.

In an embodiment the gas flow system 97 comprises a piezoelectric valve 99 (or another type of valve such as a solenoid valve) configured to control the pressure applied to the outer sub-region 93. The piezoelectric valve 99 may be controlled based on information from the pressure sensor 85. In an embodiment the controller 500 controls the piezoelectric valve 99 based on input from the pressure sensor 85. Accordingly, the controller 500 can control the pressure for each of the outer sub-regions 93 substantially independently. Similarly, in an embodiment the controller 500 can control the pressure for each intermediate sub-region 92 substantially independently. In an embodiment the controller 500 can control the pressure for each of the central sub-regions 91 substantially independently.

Accordingly, a different pressure can be applied at different tangential positions in the support table WT. This means that the support table WT has a tangential degree of freedom for controlling the clamping pressures. In an embodiment the setpoints for pressure do not differ for different tangential positions. In an embodiment, each sub-regions has its own pressure control loop. This helps to deal with substrates which are warped, i.e. curved, in a tangential direction. For example, this allows the same pressure to be applied at different tangential (i.e. rotational) positions even though the curvature of the substrate W differs at different tangential positions.

An embodiment of the invention is expected to improve the flatness of a clamped substrate W that has a non-circularly symmetrical warpage (e.g. a saddle-shaped warpage). This does not require pre-knowledge of the warpage of the substrate W that is to be clamped.

As explained above, it is possible for the gas flow system 97 to provide a pressure that is above the ambient pressure (i.e. a puff of gas) in a particular region. In an embodiment the gas flow system 97 is configured to apply gas at a pressure above ambient pressure in each sub-region independently. Accordingly, the provision of a puff of gas can be controlled depending on the tangential position within the support table WT. The tangential position means the position along a tangential (or azimuthal) direction.

In an alternative embodiment, the gas extraction system 97 is controlled to stop extracting the gas when the substrate W is a predetermined distance above the support table WT. The predetermined distance may vary depending on the lithographic apparatus. The predetermined distance may be calibrated for a particular lithographic apparatus. More particularly, in an embodiment the method for loading the substrate W onto the support table WT comprises lowering the substrate W towards the support table WT. For example, in an embodiment the substrate W is supported by a plurality of pins 70 (shown in FIG. 12) that contact the lower surface of the substrate W. The pins 70 extend vertically through the support table WT. The controller 500 is configured to control the pins 70 (e.g. via an actuator) so that the pins 70 move vertically downwards. When the pins 70 move vertically downwards, the substrate W is lowered towards the support table WT.

In an embodiment, when the substrate W is being lowered towards the support table WT, the underpressure source 87 is controlled to apply an underpressure so as to extract gas from the gap between the base surface 61 of the support table WT and the substrate W via the plurality of gas flow openings 69 in the support table WT (shown in FIGS. 8 and 9). For example, the underpressure source 87, which may be a vacuum supply, is switched on when the substrate W is being lowered towards the support table WT.

In an embodiment the controller 500 is configured to switch on the underpressure source 87 when it determines that the pins 70 are being vertically lowered. In an embodiment, as soon as the pins 70 with the substrate W move down towards the support table WT, the highest possible gas extraction flow is switched on. This is to reduce air resistance between the substrate W and the support table WT during the movement of the substrate W towards the support table WT. This also results in a faster throughput.

In an embodiment, when the substrate W reaches a predetermined distance above the support table WT, the underpressure source 87 is controlled to stop applying the underpressure that would be in fluid communication with the gas flow openings 69 in the support table WT. When the pins 70 are just above the level of the support table WT, the vacuum is switched off.

Figure 12:
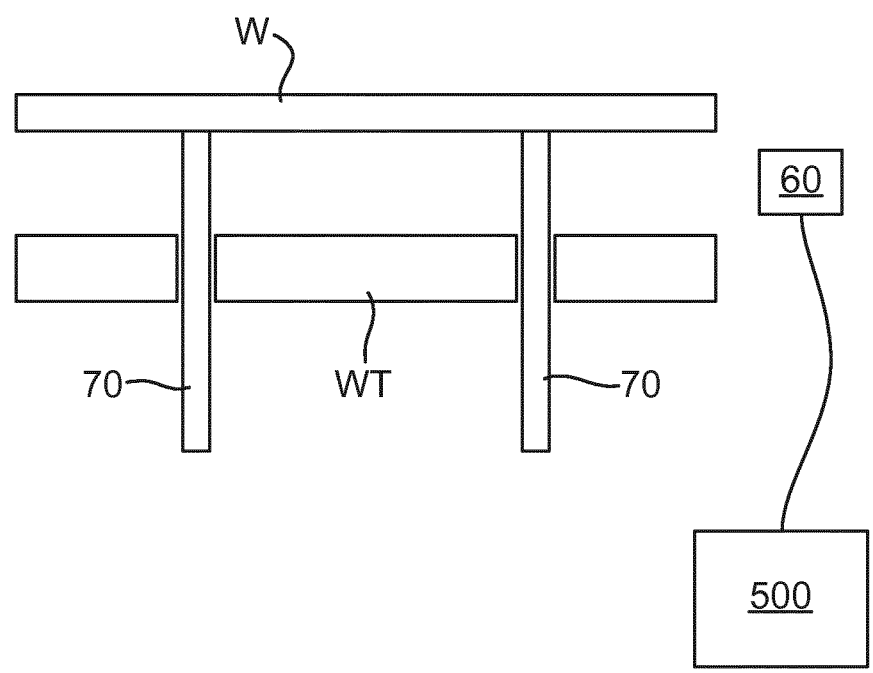
FIG. 12 schematically depicts a substrate being lowered onto the support table according to an embodiment of the invention.

In an embodiment the controller 500 is configured to monitor a vertical height of the pins 70 supporting the substrate W. As depicted in FIG. 12, in an embodiment the lithographic apparatus comprises a height sensor 60. The height sensor 60 is configured to measure the vertical position of the pins 70. The height sensor 60 is configured to output a value representative of the height of the substrate W above the support table WT. The height sensor 60 is connected to the controller 500. The height sensor 60 is configured to output signals to the controller 500 indicative of the height of the pins 70. Specifically, the height sensor 60 is configured to output signals to the controller 500 indicative of the height of the tops of the pins 70 above the support table WT. The controller 500 is configured to control the underpressure source 87 based on the signals received from the height sensor 60. In an embodiment the controller 500 is configured to control the under pressure source 87 by controlling the piezoelectric valve 99 (shown in FIGS. 8 and 9).

In an embodiment the height sensor 60 is situated near the support table WT. In an embodiment the height sensor 60 is connected to the support table WT or in or on the support table WT. Alternatively, as shown in FIG. 12, in an embodiment the height sensor 60 is separate from the support table WT.

According to the embodiment, the substrate W lands on the support table WT with no vacuum being applied. This improves the positional accuracy with which the substrate W can be clamped onto the support table WT.

In an embodiment, when the substrate W has touched down onto the support table WT, the underpressure source 87 is controlled to restart applying an under pressure so as to extract the gas from the gap via the plurality of gas flow openings 69 in the support table WT. After the substrate W has landed on the support table WT with no vacuum enabled, the vacuum is re-applied.

In an embodiment the vacuum is built up gradually from low to high flow in phases. In particular, in an embodiment when the substrate W has touched down onto the support table WT, the underpressure source 87 is controlled to build up the under pressure gradually in a plurality of phases such that the flow of the gas extracted from the gap via the plurality of gas flow openings 69 gradually increases.

Figure 10:
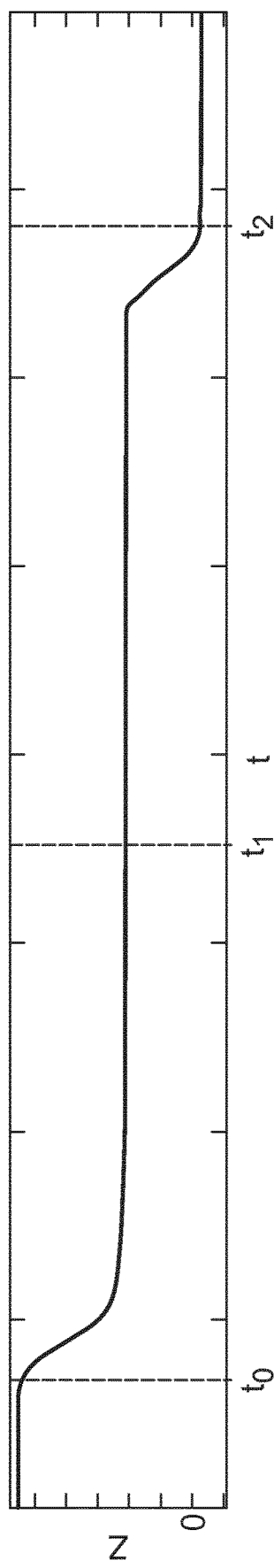
FIG. 10 shows a vertical height of the substrate over time when it is being lowered onto the support table.

FIG. 10 shows the vertical height of the substrate W above the support table WT during loading of the substrate W. The Y axis represents the vertical height in the Z-direction. The X axis represents time during the loading of the substrate W.

Figure 11:
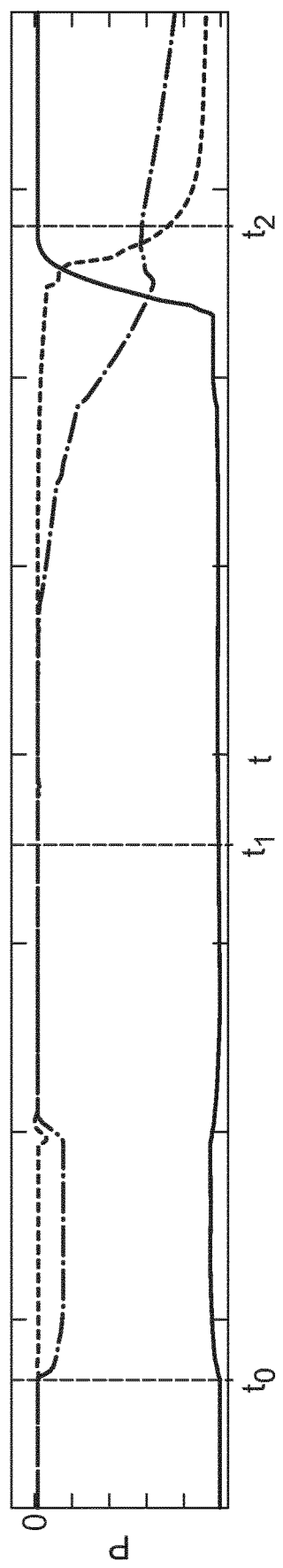
FIG. 11 shows the pressure for different parts of the lithographic apparatus when the substrate is being lowered onto the support table.

FIG. 11 shows the pressures measured at different parts of the lithographic apparatus over the same time period of loading the substrate W. The solid line represents the pressure applied to the pins 70. When the pins 70 are supporting the substrate W, a negative pressure (i.e. downwards force) is applied on the pins 70 by the weight of the substrate W. When the pins 70 no longer support the substrate W (because the substrate W is fully supported by the support table WT instead of by the pins 70), the negative pressure disappears. This can be seen in the right hand side of FIG. 11, where the solid line rises up to a zero pressure value on the Y-axis of the graph. This corresponds to the time when the substrate W is fully supported by the support table WT. This is because the weight of the substrate W no longer presses down on the pins 70 when the substrate W is fully supported by the support table WT.

The dashed line in FIG. 11 represents the pressure through the fluid extraction openings 88 (shown in FIG. 7) at the periphery of the support table WT. The vacuum is switched on for the fluid extraction openings 88 when the substrate W is fully supported by the support table WT. In FIGS. 10 and 11, the time t0 represents the time at which the pins 70 start moving downwards with the substrate W. The time t1 represents the time at which the substrate W touches down onto the support table WT. The time t2 represents the time at which the substrate W is fully supported by the support table WT.

The dot-chain line in FIG. 11 represents the under pressure for the gas flow openings 69 in the support table WT. The magnitude of the under pressure is gradually increased after the substrate W has touched down onto the support table WT.

An embodiment of the invention is expected to improve the accuracy of clamping the substrate W while also improving throughput. An embodiment of the invention is expected to make it possible to clamp a wider variety of substrates W. For example, some substrates W are flat, whereas others are more warped (i.e. less flat). As mentioned above, after the substrate W has landed on the support table WT, the vacuum is built up gradually from low to high flow in phases. Flat and low/medium warped substrates W can be clamped with the lowest possible flow leading to improved positional accuracy of the substrate W on the support table WT. Highly warped substrates W which cannot be clamped with the lowest flow can be clamped at a later point in time when the flow rate rises.

An embodiment of the invention is expected to improve the positional accuracy of clamping the substrate W onto the support table WT particularly for new substrates W (i.e.

substrates W that have not previously been used). It has been found that substrates W which are used a lot are somewhat less sensitive to positional inaccuracies during clamping.

An embodiment of the invention comprises a load sequence for a substrate W that makes use of several different pre-clamp flows. This leads to a dynamic substrate load that gives the possibility of optimising positional accuracy and throughput as well as making it possible to clamp different types of substrate W. It is possible to switch the pre-clamped vacuum at a certain vertical positions of the pins 70. In an alternative embodiment the controller 500 is configured to control the underpressure source 87 to vary the underpressure based on a certain pressure level. For example, the pressure level may be measured by the pressure sensor 85 (shown in FIG. 8).

The load sequence in which the vacuum is switched off when the pins 70 are just above the level of the support table WT can be combined with the load sequence described earlier in which gas is extracted through gas flow openings 69 in different regions during different phases of loading. In particular, in an embodiment the first phase of loading, the second phase of loading and the third phase of loading as described above are performed when the substrate W has touched down onto the support table WT. In this way, the flow is gradually increased when the substrate W has touched down onto the support table WT. However, before the substrate W has touched down onto the support table WT, gas is extracted during lowering of the substrate W and then the vacuum is switched off when the substrate W reaches a predetermined distance above the support table WT.

The load sequence in which the vacuum is switched off when the pins 70 are just above the level of the support table WT can be implemented on any type of support table WT. The support table described above and shown in FIG. 5, which has three separate vacuum areas, is only one example of the type of support table WT that can be used. Other support tables WT that can be used may have only one or two vacuum areas, for example.

In an embodiment the lithographic apparatus comprises a controller 500 configured to control the gas flow system 97. The controller 500 can implement the sequences of applied pressures described above.

Many of the examples above have been described in the context of an immersion lithographic apparatus. However, the invention is equally applicable to a dry lithographic apparatus. As will be appreciated, any of the above-described features can be used with any other feature and it is not only those combinations explicitly described which are covered in this application.

Clauses representing alternative arrangements of a lithographic according to the invention are listed below.

Clause 1. A method for unloading a substrate from a support table configured to support the substrate, the method comprising:
supplying gas to a gap between a base surface of the support table and the substrate via a plurality of gas flow openings in the support table,
wherein during an initial phase of unloading the gas is supplied through at least one gas flow opening in an outer region of the support table and not through any gas flow opening in a central region of the support table radially inward of the outer region, and
during a subsequent phase of unloading the gas is supplied through at least one gas flow opening in the outer region and at least one gas flow opening in the central region.

Clause 2. The method of clause 1, wherein:
during the initial phase of unloading the gas is supplied through at least one gas flow opening in the outer region and not through any gas flow opening in the central region and any gas flow opening in an intermediate region of the support table radially inward of the outer region and radially outward of the central region,
during an intermediate phase of unloading the gas is supplied through at least one gas flow opening in the outer region and at least one gas flow opening in the intermediate region and not through any gas flow opening in the central region, and
during the subsequent phase of unloading the gas is supplied through at least one gas flow opening in the outer region, at least one gas flow opening in the intermediate region and at least one gas flow opening in the central region.

Clause 3. The method of clause 2, wherein:
during the intermediate phase of unloading gas is supplied through at least one gas flow opening in the intermediate region at a first pressure greater than ambient pressure, following which gas is supplied through at least one gas flow opening in the intermediate region at a second pressure less than the first pressure.

Clause 4. The method of any preceding clause, wherein:
during the initial phase of unloading gas is supplied through at least one gas flow opening in the outer region at a first pressure greater than ambient pressure, following which gas is supplied through at least one gas flow opening in the outer region at a second pressure less than the first pressure.

Clause 5. The method of any preceding clause, wherein:
during the subsequent phase of unloading gas is supplied through at least one gas flow opening in the central region at a first pressure greater than ambient pressure, following which gas is supplied through at least one gas flow opening in the central region at a second pressure less than the first pressure.

Clause 6. A method for loading a substrate onto a support table configured to support the substrate, the method comprising:
extracting gas from a gap between a base surface of the support table and the substrate via a plurality of gas flow openings in the support table,
wherein during a first phase of loading the gas is extracted through at least one gas flow opening in a central region of the support table and not through any gas flow opening in an intermediate region of the support table radially outward of the central region and any gas flow opening in an outer region of the support table radially outward of the intermediate region,
during a second phase of loading the gas is extracted through at least one gas flow opening in the central region and at least one gas flow opening in the intermediate region and not through any gas flow opening in the outer region, and
during a third phase of loading the gas is extracted through at least one gas flow opening in the central region, at least one gas flow opening in the intermediate region and at least one gas flow opening in the outer region.

Clause 7. The method of clause 6, wherein:
during the first phase of loading gas at a pressure greater than ambient pressure is supplied through at least one gas flow opening in the intermediate region and/or at least one gas flow opening in the outer region.

Clause 8. The method of clause 6 or 7, wherein:
  during the second phase of loading gas is supplied through at least one gas flow opening in the outer region at a pressure greater than ambient pressure.

Clause 9. The method of any of clauses 6 to 8, wherein:
  when the substrate is being lowered towards the support table, the gas is extracted through at least one gas flow opening in the central region, at least one gas flow opening in the intermediate region and at least one gas flow opening in the outer region;
  when the substrate reaches a predetermined distance above the support table, the gas is not extracted through any gas flow opening in the central region, any gas flow opening in the intermediate region and any gas flow opening in the outer region; and
  when the substrate has touched down onto the support table, the first phase of loading, the second phase of loading and the third phase of loading are performed.

Clause 10. The method of any of clauses 2 to 9, comprising:
  restricting a flow of gas between the central region and the intermediate region so that gas can be extracted from or supplied to the gap for each of the central region and the intermediate region substantially independently.

Clause 11. The method of any of clauses 2 to 10, wherein the intermediate region surrounds the central region.

Clause 12. The method of any of clauses 2 to 11, wherein the intermediate region is defined at its radially outer periphery by an intermediate region wall protruding above the base surface and restricting a flow of gas between the intermediate region and the outer region.

Clause 13. The method of any of clauses 2 to 11, wherein the intermediate region comprises a plurality of non-overlapping intermediate sub-regions between which a flow of gas is restricted.

Clause 14. The method of clause 13, wherein each intermediate sub-region is defined by an intermediate sub-region wall protruding above the base surface and restricting a flow of gas between the intermediate region and the central region or the outer region.

Clause 15. The method of clause 13 or 14, wherein the intermediate sub-regions are spaced from each other.

Clause 16. The method of clause 13 to 15, wherein gas can be extracted from or supplied to the gap for each of the intermediate sub-regions substantially independently of each other.

Clause 17. The method of any of clauses 2 to 16, comprising:
  restricting a flow of gas between the intermediate region and the outer region so that gas can be extracted from or supplied to the gap for each of the intermediate region and the outer region substantially independently.

Clause 18. The method of any of clauses 2 to 17, wherein the outer region surrounds the intermediate region.

Clause 19. The method of any preceding clause, comprising:
  restricting a flow of gas between the central region and the outer region so that gas can be extracted from or supplied to the gap for each of the central region and the outer region substantially independently.

Clause 20. The method of any preceding clause, wherein the central region is defined by a central region wall protruding above the base surface of the support table and restricting a flow of gas between the central region and the outer region.

Clause 21. The method of any of clauses 1 to 19, wherein the central region comprises a plurality of non-overlapping central sub-regions between which a flow of gas is restricted.

Clause 22. The method of clause 21, wherein each central sub-region is defined by a central sub-region wall protruding above the base surface and restricting a flow of gas between the central region and the outer region.

Clause 23. The method of clause 21 or 22, wherein the central sub-regions are spaced from each other.

Clause 24. The method of clause 21 to 23, wherein gas can be extracted from or supplied to the gap for each of the central sub-regions substantially independently of each other.

Clause 25. The method of any preceding clause, wherein the outer region is defined at its radially outer periphery by an outer region wall protruding above the base surface and restricting a flow of gas between outer region and any region radially outward of the outer region.

Clause 26. The method of any of clauses 1 to 24, wherein the outer region comprises a plurality of non-overlapping outer sub-regions between which a flow of gas is restricted.

Clause 27. The method of clause 26, wherein each outer sub-region is defined by an outer sub-region wall protruding above the base surface and restricting a flow of gas between outer region and any region radially outward of the outer region.

Clause 28. The method of clause 26 or 27, wherein the outer sub-regions are spaced from each other.

Clause 29. The method of clause 26 to 28, wherein gas can be extracted from or supplied to the gap for each of the outer sub-regions substantially independently of each other.

Clause 30. A lithographic apparatus comprising:
  a gas flow system;
  a controller configured to control the gas flow system; and
  a support table configured to support a substrate, wherein the support table comprises:
    a base surface;
    a central region;
    an outer region radially outward of the central region; and
    a plurality of gas flow openings through which the gas flow system is configured to supply gas to a gap between the base surface and the substrate; and
  wherein when the substrate is to be unloaded from the support table:
    during an initial phase of unloading the controller is configured to control the gas flow system to supply the gas through at least one gas flow opening in the outer region and not through any gas flow opening in the central region, and
    during a subsequent phase of unloading the controller is configured to control the gas flow system to supply the gas through at least one gas flow opening of the outer region and at least one gas flow opening of the central region.

Clause 31. The lithographic apparatus of clause 30, wherein:
  the support table comprises an intermediate region radially outward of the central region and radially inward of the outer region; and
  when the substrate is to be unloaded from the support table:
    during the initial phase of unloading the controller is configured to control the gas flow system to supply the gas through at least one gas flow opening in the outer region and not through any gas flow opening in the central region and any gas flow opening in the intermediate region,
    during an intermediate phase of unloading the controller is configured to control the gas flow system to supply the gas through at least one gas flow opening in the outer region and at least one gas flow opening in the intermediate region and not through any gas flow opening in the central region, and during the subsequent phase of unloading the controller is configured to control the gas flow system to supply the gas through at least one gas flow opening in the outer region, at least one gas flow opening in the intermediate region and at least one gas flow opening in the central region.

Clause 32. The lithographic apparatus of clause 31, wherein:

during the intermediate phase of unloading the controller is configured to control the gas flow system to supply gas through at least one gas flow opening in the intermediate region at a first pressure greater than ambient pressure, and then to supply gas through at least one gas flow opening in the intermediate region at a second pressure less than the first pressure.

Clause 33. The lithographic apparatus of any of clauses 30 to 32, wherein:

during the initial phase of unloading the controller is configured to control the gas flow system to supply gas through at least one gas flow opening in the outer region at a first pressure greater than ambient pressure, and then to supply gas through at least one gas flow opening in the outer region at a second pressure less than the first pressure.

Clause 34. The lithographic apparatus of any of clauses 30 to 33, wherein:

during the subsequent phase of unloading the controller is configured to control the gas flow system to supply gas through at least one gas flow opening in the central region at a first pressure greater than ambient pressure, and then to supply gas through at least one gas flow opening in the central region at a second pressure less than the first pressure.

Clause 35. A lithographic apparatus comprising:
a gas flow system;
a controller configured to control the gas flow system; and
a support table configured to support a substrate, wherein the support table comprises:
a base surface;
a central region;
an intermediate region radially outward of the central region;
an outer region radially outward of the intermediate region; and
a plurality of gas flow openings through which the gas flow system is configured to extract gas from a gap between the base surface and the substrate;
wherein when the substrate is being loaded onto the support table:
during a first phase of loading the controller is configured to control the gas flow system to extract the gas through at least one gas flow opening in the central region and not through any gas flow opening in the intermediate region and any gas flow opening in the outer region,
during a second phase of loading the controller is configured to control the gas flow system to extract the gas through at least one gas flow opening in the central region and at least one gas flow opening in the intermediate region and not through any gas flow opening in the outer region, and
during a third phase of loading the controller is configured to control the gas flow system to extract the gas through at least one gas flow opening in the central region, at least one gas flow opening in the intermediate region and at least one gas flow opening in the outer region.

Clause 36. The lithographic apparatus of clause 35, wherein:

during the first phase of loading the controller is configured to control the gas flow system to supply gas at a pressure greater than ambient pressure through at least one gas flow opening in the intermediate region and/or at least one gas flow opening in the outer region.

Clause 37. The lithographic apparatus of clause 35 or 36, wherein:

during the second phase of loading the controller is configured to control the gas flow system to supply gas through at least one gas flow opening in the outer region at a pressure greater than ambient pressure.

Clause 38. The lithographic apparatus of any of clauses 35 to 37, wherein:

when the substrate is being lowered towards the support table, the controller is configured to control the gas flow system to extract the gas through at least one gas flow opening in the central region, at least one gas flow opening in the intermediate region and at least one gas flow opening in the outer region;

when the substrate reaches a predetermined distance above the support table, the controller is configured to control the gas flow system to not extract the gas through any gas flow opening in the central region, any gas flow opening in the intermediate region and any gas flow opening in the outer region; and when the substrate has touched down onto the support table, the controller is configured to control the gas flow system to perform the first phase of loading, the second phase of loading and the third phase of loading.

Clause 39. The lithographic apparatus of any of clauses 31 or 37, wherein the central region is defined by a central region wall protruding above the base surface and configured to restrict a flow of gas between the central region and the intermediate region so that gas can be supplied to or extracted from the gap for each of the central region and the intermediate region substantially independently.

Clause 40. The lithographic apparatus of any of clauses 31 to 39, wherein the intermediate region surrounds the central region.

Clause 41. The lithographic apparatus of any of clauses 31 to 40, wherein the intermediate region is defined at its radially outer periphery by an intermediate region wall protruding above the base surface and restricting a flow of gas between the intermediate region and the outer region.

Clause 42. The lithographic apparatus of any of clauses 31 to 40, wherein the intermediate region comprises a plurality of non-overlapping intermediate sub-regions, wherein each intermediate sub-region is defined by an intermediate sub-region wall protruding above the base surface and restricting a flow of gas between the intermediate region and the outer region so that gas can be supplied to or extracted from the gap for each of the intermediate region and the outer region substantially independently.

Clause 43. The lithographic apparatus of clause 42, wherein the intermediate sub-regions are spaced from each other.

Clause 44. The lithographic apparatus of clause 42 or 43, wherein the gas flow system is configured to extract gas from or supply gas to the gap for each of the intermediate sub-regions substantially independently of each other.

Clause 45. The lithographic apparatus of any of clauses 31 to 44, wherein the outer region surrounds the intermediate region.

Clause 46. The lithographic apparatus of any of clauses 30 to 45, wherein the gas flow system comprises:
  a central flow channel connected to the at least one gas flow opening in the central region; and
  an outer flow channel connected to the at least one gas flow opening in the outer region, wherein the central flow channel is independent from the outer flow channel.

Clause 47. The lithographic apparatus of any of clauses 31 to 45, wherein the gas flow system comprises:
  a central flow channel connected to the at least one gas flow opening in the central region;
  an intermediate flow channel connected to the at least one gas flow opening in the intermediate region; and
  an outer flow channel connected to the at least one gas flow opening in the outer region; wherein the central flow channel, the intermediate flow channel and the outer flow channel are independent from each other.

Clause 48. The lithographic apparatus of clause 46 or 47, wherein the gas flow system comprises at least one piezoelectric valve configured to vary a flow rate through the central flow channel, the intermediate flow channel and/or the outer flow channel.

Clause 49. The lithographic apparatus of any of clauses 46 to 48, comprising at least one pressure sensor configured to sense a pressure of the central flow channel, the intermediate flow channel and/or the outer flow channel,
  wherein the controller is configured to vary a flow rate through the central flow channel, the intermediate flow channel and/or the outer flow channel based on the pressure sensed by the pressure sensor.

Clause 50. The lithographic apparatus of any of clauses 30 to 49, wherein the central region is defined by a central region wall protruding above the base surface and configured to restrict a flow of gas between the central region and the outer region so that gas can be supplied to or extracted from the gap for each of the central region and the outer region substantially independently.

Clause 51. The lithographic apparatus of any of clauses 30 to 49, wherein the central region comprises a plurality of non-overlapping central sub-regions, wherein each central sub-region is defined by a central sub-region wall protruding above the base surface and restricting a flow of gas between the central region and the outer region so that gas can be supplied to or extracted from the gap for each of the central region and the outer region substantially independently.

Clause 52. The lithographic apparatus of clause 51, wherein the central sub-regions are spaced from each other.

Clause 53. The lithographic apparatus of clause 51 or 52, wherein the gas flow system is configured to extract gas from or supply gas to the gap for each of the central sub-regions substantially independently of each other.

Clause 54. The lithographic apparatus of any of clauses 30 to 53, wherein the outer region is defined at its radially outer periphery by an outer region wall protruding above the base surface and restricting a flow of gas between the outer region and any region radially outward of the outer region.

Clause 55. The lithographic apparatus of any of clauses 30 to 54, wherein the outer region comprises a plurality of non-overlapping outer sub-regions between which a flow of gas is restricted, wherein each outer sub-region is defined by an outer sub-region wall protruding above the base surface and restricting a flow of gas between the central region and the outer region.

Clause 56. The lithographic apparatus of clause 55, wherein the outer sub-regions are spaced from each other.

Clause 57. The lithographic apparatus of clause 55 or 56, wherein the gas flow system is configured to extract gas from or supply gas to the gap for each of the outer sub-regions substantially independently of each other.

Clause 58. A method for loading a substrate onto a support table configured to support the substrate, the method comprising:
  lowering the substrate towards the support table;
  when the substrate is being lowered towards the support table, controlling an underpressure source to apply an underpressure so as to extract gas from a gap between a base surface of the support table and the substrate via a plurality of gas flow openings in the support table,
  when the substrate reaches a predetermined distance above the support table, controlling the underpressure source to stop applying an underpressure in fluid communication with any of the gas flow openings in the support table; and
  when the substrate has touched down onto the support table, controlling the underpressure source to restart applying an underpressure so as to extract the gas via the plurality of gas flow openings in the support table.

Clause 59. The method of clause 58, wherein when the substrate has touched down onto the support table, the underpressure source is controlled to build up the underpressure gradually in a plurality of phases such that a flow of the gas extracted from the gap via the plurality of gas flow openings gradually increases.

Clause 60. A lithographic apparatus comprising:
  a gas flow system comprising an underpressure source;
  a controller configured to control the gas flow system; and
  a support table configured to support a substrate,
  wherein when the substrate is being lowered towards the support table, the controller is configured to control the underpressure source to apply an underpressure so as to extract gas from a gap between the support table and the substrate via a plurality of gas flow openings in the support table,
  when the substrate reaches a predetermined distance above the support table, the controller is configured to control the underpressure source to stop applying an underpressure in fluid communication with any of the gas flow openings in the support table; and
  when the substrate has touched down onto the support table, the controller is configured to control the underpressure source to restart applying an underpressure so as to extract the gas via the plurality of gas flow openings in the support table.

Clause 61. A method for loading a substrate onto a support table configured to support the substrate, the method comprising:
  extracting gas from a gap between a base surface of the support table and the substrate via a plurality of gas flow openings in the support table,
  wherein during a first phase of loading the gas is extracted through at least one gas flow opening in an outer region of the support table and not through any gas flow opening in an intermediate region of the support table radially inward of the outer region and any gas flow opening in a central region of the support table radially inward of the intermediate region,
  during a second phase of loading the gas is extracted through at least one gas flow opening in the outer region and at least one gas flow opening in the intermediate region and not through any gas flow opening in the central region, and during a third phase of loading the gas is extracted through at least one gas flow opening in the outer region, at least one gas flow opening in the intermediate region and at least one gas flow opening in the central region.

Clause 62. A lithographic apparatus comprising:
a gas flow system;
a controller configured to control the gas flow system; and
a support table configured to support a substrate, wherein the support table comprises:
a base surface;
a central region;
an intermediate region radially outward of the central region;
an outer region radially outward of the intermediate region; and
a plurality of gas flow openings through which the gas flow system is configured to extract gas from a gap between the base surface and the substrate;
wherein each region is provided with:
a flow channel in fluid communication with the gas flow openings in that region; and
a pressure sensor configured to sense a pressure of the flow channel;
wherein when the substrate is being loaded onto the support table the controller is configured to control timing of extracting gas through the gas flow openings in each region based on the sensed pressure of each flow channel.

Clause 63. The lithographic apparatus of clause 62, wherein at least one of the regions comprises a plurality of tangentially distributed sub-regions, wherein each sub-region is provided with:
a flow channel in fluid communication with the gas flow openings in that sub-region; and
a pressure sensor configured to sense a pressure of the flow channel;
wherein when the substrate is being loaded onto the support table the controller is configured to control timing of extracting gas through the gas flow openings in each sub-region based on the sensed pressure of each flow channel.

As will be appreciated, any of the above described features can be used with any other feature and it is not only those combinations explicitly described which are covered in this application. For example, an embodiment of the invention could be applied to the embodiment of FIG. 3. Furthermore, although embodiments of the invention have been described above in the context of an immersion lithographic apparatus for convenience, it will be appreciated that an embodiment of the invention may be used in conjunction with any form of lithographic apparatus.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a patterning device support configured to support a patterning device, the patterning device configured to provide a patterned radiation beam;
a projection system configured to project the patterned radiation beam onto a radiation-sensitive substrate; and
a support table configured to support the substrate, the support table having a radius $r_0$ and comprising:
a base surface having at least 10 burls;
a central region;
an intermediate region radially outward of the central region;
an outer region radially outward of the intermediate region;
a plurality of gas flow openings configured to extract gas from a gap between the base surface and the substrate when supported on the support table;
a flow channel in fluid communication with the plurality of gas flow openings; and
a seal around the burls, the central region and the plurality of gas flow openings, the seal in the form of one or more protrusions protruding away from the gas flow openings and surrounding the burls, the one or more protrusions having a distal end at a different distance from the base surface than distal ends of the burls, the one or more protrusions configured to restrict a majority of flow of fluid, coming from an environment outward of the substrate, between the substrate, when supported on the support table, and the base surface toward the central region, and each of the one or more protrusions located outward, relative to a central portion of the support table, of each of the burls, of the central region and of each of the plurality of gas flow openings,
wherein the plurality of gas flow openings is positioned a radial distance $r_2$ from a central portion of the support table, the plurality of gas flow openings arranged such that $r_2{:}r_0$ is between 0.5 and 0.8, and
wherein, along the entire length of a radial direction from the central portion to outside of the burls, the one or more protrusions are the only one or more protrusions having a distal end at the different distance from the base surface than distal ends of the burls.

2. A support table configured to support a substrate, the support table having a radius $r_0$ and comprising:
a base surface having at least 10 burls;
a central region;
an intermediate region radially outward of the central region;
an outer region radially outward of the intermediate region;

a plurality of gas flow openings configured to extract gas from a gap between the base surface and the substrate when supported on the support table;

a flow channel in fluid communication with the plurality of gas flow openings; and a seal around the burls, the central region and the plurality of gas flow openings, the seal in the form of one or more protrusions protruding away from the gas flow openings and surrounding the burls, the one or more protrusions having a distal end at a different distance from the base surface than distal ends of the burls, the one or more protrusions configured to restrict a majority of flow of fluid, coming from an environment outward of the substrate, between the substrate, when supported on the support table, and the base surface toward the central region, and each of the one or more protrusions located outward, relative to a central portion of the support table, of each of the burls, of the central region and of each of the plurality of gas flow openings, wherein the plurality of gas flow openings is positioned a radial distance $r_2$ from a central portion of the support table, the plurality of gas flow openings arranged such that $r_2:r_0$ is between 0.5 and 0.8, and wherein, along the entire length of a radial direction from the central portion to outside of the burls, the one or more protrusions are the only one or more protrusions having a distal end at the different distance from the base surface than distal ends of the burls.

3. The support table of claim 2, wherein the plurality of gas flow openings is arranged such that $r_2:r_0$ is at about 0.6.

4. The support table of claim 2, further comprising a fluid extraction opening outward, relative to the central portion, of the seal.

5. The support table of claim 2, further comprising a pressure sensor configured to sense a pressure of the intermediate region.

6. The support table of claim 5, wherein the pressure sensor is configured to sense the pressure in the flow channel.

7. The support table of claim 2, wherein the plurality of gas flow openings are first gas flow openings and further comprising a plurality of second gas flow openings radially inwards of the plurality of first gas flow openings.

8. The support table of claim 7, wherein the plurality of second gas flow openings is positioned a radial distance $r_1$ from the central portion of the support table, the plurality of second gas flow openings is arranged such that $r_1:r_0$ is between 0.2 and 0.5.

9. The support table of claim 2, wherein the plurality of gas flow openings are first gas flow openings and further comprising a plurality of second gas flow openings radially outward of the plurality of first gas flow openings.

10. The support table of claim 9, wherein the plurality of second gas flow openings is positioned a radial distance $r_3$ from the central portion of the support table, the plurality of second gas flow openings is arranged such that $r_3:r_0$ is between 0.5 and 0.95.

11. The support table of claim 9, configured so that, for loading the substrate onto the support table:
during a first phase of the loading, gas is extracted through at least one gas flow opening in the central region and not through any gas flow opening in the intermediate region and in the outer region,
during a second phase of the loading, gas is extracted through at least one gas flow opening in the central region and at least one gas flow opening in the intermediate region and not through any gas flow opening in the outer region, and
during a third phase of the loading, gas is extracted through at least one gas flow opening in the central region, at least one gas flow opening in the intermediate region and at least one gas flow opening in the outer region.

12. A lithographic apparatus, comprising:
a pattern transfer system configured to transfer a pattern onto a substrate; and
the support table of claim 2.

13. A support table configured to support a substrate, the support table comprising:
a base surface having at least 10 burls;
a central region having at least one gas flow opening configured to extract gas from a gap between the base surface and the substrate when supported on the support table;
an intermediate region radially outward of the central region, the intermediate region having at least one gas flow opening configured to extract gas from a gap between the base surface and the substrate when supported on the support table;
an outer region radially outward of the intermediate region, the outer region having at least one gas flow opening configured to extract gas from a gap between the base surface and the substrate when supported on the support table; and
a seal around the burls and around the at least one gas flow opening in each of the central, intermediate and outer regions, the seal in the form of one or more protrusions surrounding the burls, the one or more protrusions each having a distal end at a different distance from the base surface than distal ends of the burls, the one or more protrusions configured to restrict a majority of flow of fluid, coming from an environment outward of the substrate, between the substrate, when supported on the support table, and the base surface toward the central region, and each of the one or more protrusions located outward, relative to a central portion of the support table, of each of the burls, of the central region and of each of the plurality of gas flow openings,
wherein, along the entire length of a radial direction from a central portion of the base surface to outside of the burls, the one or more protrusions are the only one or more protrusions having a distal end at the different distance from the base surface than distal ends of the burls, and
wherein the support table is configured such that, for loading the substrate onto the support table:
during a first phase of the loading, gas is extracted through the at least one gas flow opening in the central region and not through any gas flow opening in the intermediate region and in the outer region,
during a second phase of the loading, gas is extracted through the at least one gas flow opening in the central region and the at least one gas flow opening in the intermediate region and not through any gas flow opening in the outer region, and
during a third phase of the loading, gas is extracted through the at least one gas flow opening in the central region, the at least one gas flow opening in the intermediate region and the at least one gas flow opening in the outer region.

14. The support table of claim 13, wherein the support table has a radius $r_0$ and the at least one gas flow opening positioned in the intermediate region is positioned a radial distance $r_2$ from the central portion of the support table, the at least one gas flow opening positioned in the intermediate region arranged such that $r_2:r_0$ is between 0.5 and 0.8.

15. The support table of claim 14, wherein the support table has a radius $r_0$ and the at least one gas flow opening positioned in the central region is positioned a radial distance $r_1$ from the central portion of the support table, the at least one gas flow opening positioned in the central region arranged such that $r_1:r_0$ is between 0.2 and 0.5.

16. The support table of claim 13, further comprising a fluid extraction opening located radially outward of the protrusion.

17. The support table of claim 13, further comprising a pressure sensor configured to sense a pressure at the gap between the base surface and the substrate when supported on the support table.

18. A lithographic apparatus, comprising:
a pattern transfer system configured to transfer a pattern onto a substrate; and
the support table of claim 13.

19. A support table configured to support a substrate, the support table having a radius $r_0$ and comprising:
a base surface having at least 10 burls and a central region;
a plurality of gas flow openings configured to extract gas from a gap between the base surface and the substrate when supported on the support table; and
a seal around the burls, the plurality of gas flow openings and the central region, the seal in the form of one or more protrusions protruding away from the gas flow openings and surrounding the burls, the one or more protrusions each having a distal end at a different distance from the base surface than distal ends of the burls, the one or more protrusions configured to restrict a majority of flow of fluid, coming from an environment outward of the substrate, between the substrate, when supported on the support table, and the base surface toward the central region, and each of the one or more protrusions located outward, relative to a central portion of the support table, of each of the burls, of the central region and of each of the plurality of gas flow openings, wherein the plurality of gas flow openings is positioned a radial distance $r_1$ from a central portion of the support table, the plurality of gas flow openings is arranged such that $r_1:r_0$ is between 0.2 and 0.5, and wherein, along the entire length of a radial direction from the central portion to outside of the burls, the one or more protrusions are the only one or more protrusions having a distal end at the different distance from the base surface than distal ends of the burls.

20. The support table of claim 19, further comprising a fluid extraction opening outward, relative to the central portion, of the seal.

21. The support table of claim 19, further comprising a plurality of gas flow openings positioned a radial distance $r_2$ from the central portion of the support table such that $r_2:r_0$ is between 0.5 and 0.8.

22. The support table of claim 19, configured so that, for loading the substrate onto the support table:
during a first phase of the loading, gas is extracted through at least one gas flow opening in a central region of the support table and not through any gas flow opening in an intermediate region of the support table and in an outer region of the support table,
during a second phase of the loading, gas is extracted through at least one gas flow opening in the central region and at least one gas flow opening in the intermediate region and not through any gas flow opening in the outer region, and
during a third phase of the loading, gas is extracted through at least one gas flow opening in the central region, at least one gas flow opening in the intermediate region and at least one gas flow opening in the outer region.

23. The support table of claim 19, further comprising a pressure sensor configured to sense a pressure of a region of the support table.

24. A lithographic apparatus, comprising:
a pattern transfer system configured to transfer a pattern onto a substrate; and
the support table of claim 19.

* * * * *